(12) United States Patent
Setoguchi

(10) Patent No.: US 6,467,972 B2
(45) Date of Patent: Oct. 22, 2002

(54) OPTICAL INTERCONNECTION MODULE

(75) Inventor: Katsuhide Setoguchi, Kashihara (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/795,828

(22) Filed: Feb. 27, 2001

(65) Prior Publication Data

US 2001/0017964 A1 Aug. 30, 2001

(30) Foreign Application Priority Data

| Feb. 29, 2000 | (JP) | ............................. 2000-054970 |
| Oct. 31, 2000 | (JP) | ............................. 2000-333609 |
| Jan. 31, 2001 | (JP) | ............................. 2001-023415 |

(51) Int. Cl.[7] .............................................. G02B 6/36
(52) U.S. Cl. ................................................... 385/88
(58) Field of Search ............................ 385/88, 89, 90, 385/91, 92, 147

(56) References Cited

U.S. PATENT DOCUMENTS 6,130,444 A * 10/2000 Hashizume et al. .......... 257/81
6,220,764 B1 * 4/2001 Kato et al. .................. 264/1.25
6,282,350 B1 * 8/2001 Takahashi et al. ............ 385/33
6,282,352 B1 * 8/2001 Kato et al. .................. 264/1.25

* cited by examiner

Primary Examiner—Tulsidas Patel
(74) Attorney, Agent, or Firm—Hogan & Hartson, LLP

(57) ABSTRACT

In an optical interconnection module used for data communication, or the like, a semiconductor laser for emitting laser light and a photodiode for monitoring irradiation of the light by the laser are fixed on a first mounting base member made of a single crystalline silicon. An optical fiber is held on a V-shaped groove on the first mounting base member for facing the light emitting layer of the laser. At least a gap between the laser and the optical fiber is filled by a transparent resin having a refractive index equal to or larger than that of the optical fiber but smaller than the light wave guide layer of the laser. The transparent resin portion is further covered by non-transparent resin. The first mounting base member is fixed on a second mounting base member made of ceramic material having thermal expansion coefficient larger than that of the first mounting base but smaller than a circuit substrate made of epoxy resin.

17 Claims, 17 Drawing Sheets

OPTICAL INTERCONNECTION MODULE

This application is based on patent applications 2000-054970, 2000-333609, and 2001-023415 filed in Japan, the contents of which are hereby incorporated by references.

BACKGROUND OF THE INVENTION

1. Field of the Invention

The present invention relates to an optical interconnection module used for optical data transmission and reception such as optical fiber communication.

2. Description of the Related Art

In a conventional optical interconnection module used for optical data communication, an optical semiconductor device such as a semiconductor laser for emitting light and an optical fiber optically interconnected to the laser are held on the same mounting substrate. Conductive patterns or electrodes are formed on the surface of the mounting substrate for supplying electric power to the optical semiconductor device. Furthermore, a V-shaped groove, on which the optical fiber is held, is formed on the mounting substrate. For realizing a desired interconnection efficiency, it is necessary to form the electrode and the V-shaped groove precisely on the mounting substrate so as to face the optical semiconductor device and the optical fiber precisely.

On the other hand, a condenser lens is used for interconnecting the optical semiconductor device and the optical fiber so as to obtain a desired interconnection efficiency. Since the optical semiconductor device and the optical fiber are fixed on the precisely finished mounting substrate, the optical semiconductor device and the optical fiber can be positioned much closer, and the condenser lens can achieve the desired interconnection efficiency.

A configuration of a first conventional optical interconnection module 70, for example, shown in Publication Gazette of Japanese Patent Application Hei 7-63957 is shown in FIG. 19.

As can be seen from FIG. 19, an optical semiconductor device such as semiconductor laser 72 is fixed on a mounting substrate 80, and an optical fiber 82 is fixed on a V-shaped groove 86 to be optically interconnected with the semiconductor laser 72. The mounting substrate 80 is contained in a cavity 74 of a package 71. A narrow groove 81 and a wide groove 75 are formed on a top surface of the package 71. The optical fiber 82 is directly disposed in the narrow groove 81. A portion of the optical fiber 82 disposed in the wide groove 75 is covered by a protection film 83 and a ferrule 78 made of a glass tube. A metal plate 77 is fixed on the top surface of the package 71 for enclosing the cavity 74. A cover 85 is further fixed on the metal plate 77 for closing an upper opening of the cavity 74.

For sealing the cavity 74, glass powder having a low melting point is filled in the narrow groove 81, and the glass powder is locally heated to be melted by irradiation of laser light beam such as $CO_2$ laser. Thus, melted glass seals the gap between the optical fiber 82 and the narrow groove 81.

A second conventional optical interconnection module with respect to the sealed packaging is proposed in Publication Gazette of Japanese Patent Application Hei 10-227953 (not shown in the figure). A gel resin having a refractive index larger than that of air but smaller than that of the optical fiber and optically transparency is filled in the cavity. A portion in which the gel resin is filled is further sealed by another resin having moisture resistance.

On the other hand, it is necessary to maintain a temperature of the optical semiconductor device at low and constant level for stabling the operation of the optical interconnection module by restricting the temperature rise due to the heat generated in the optical semiconductor device and an electronic circuit used for controlling the optical semiconductor device.

A configuration of a third conventional optical interconnection module 50, for example, shown in Publication Gazette of Japanese Patent Application Hei 10-282373 is shown in FIG. 20.

As can be seen from FIG. 20, an optical semiconductor device such as a semiconductor laser 52 is fixed on a first mounting substrate 53, and a driving circuit 54 is fixed on a second mounting substrate 55. The first and second mounting substrates 53 and 55 are respectively contained in the same cavity of a package 51. An optical fiber 56 is optically interconnected with the semiconductor laser 52 by a condenser lens 57. The semiconductor laser 52 is electrically connected to electrodes 58 and 59 formed on the first mounting substrate 53 and the driving circuit 54 on the second mounting substrate 55 by bonding wires 60.

When an electric current flows in the driving circuit 54 for driving and controlling the semiconductor laser 52, the driving circuit 54 is heated by the current flow, and the temperature of the driving circuit 54 increases. Similarly, when the semiconductor laser 52 is driven for emitting a light beam, the semiconductor laser 52 is heated by the energy conversion from electric energy to light energy, and the temperature of the semiconductor laser 52 increases. If the semiconductor laser 52 and the driving circuit 54 are fixed on the same mounting substrate, the temperature of the semiconductor laser 52 becomes much higher due to not only the self-heating but also the heat from the driving circuit 54. When the temperature of the semiconductor laser 52 is risen, a frequency of the oscillated laser light will be varied and the output power will be reduced, so that they will be the cause of troubles of the optical interconnection module. For solving there problems, the mounting substrates are divided into the first mounting substrate 53 on which the semiconductor laser 52 is fixed and the second mounting substrate 55 on which the driving circuit 54 is fixed.

In the above-mentioned first conventional optical interconnection module 70 shown in FIG. 19, the optical fiber 82 and the glass tube 78 are held on the package 71. When the package 71 is formed by lamination of ceramic thin plates, there is a possibility that the center axis of the narrow groove 81 and/or the center axis of the wide groove 75 is/are largely discrepant from the center of the package 71.

Furthermore, the mounting substrate 80, on which the semiconductor laser 72 and the optical fiber 82 are held, is fixed on the bottom of the cavity 74 of the package 71. It, however, is difficult to coincide a center axis of the V-shaped groove 86 on the mounting substrate 80 with the center axis of the narrow groove 81 by basing on an outer shape of the mounting substrate 80. The mounting substrate 80 is generally manufactured by the following method. A plurality of V-shaped grooves 86 are formed at predetermined positions on the same wafer having a size of several inches. Subsequently, each mounting substrate 80 with the V-shaped groove 86 is cut from the wafer by dicing. Since the dicing has a tolerance inevitably, it is difficult to finish the outer shape of the mounting substrate 80 precisely by dicing.

When the optical fiber 82 is fixed on the mounting substrate 80 and the package 71 with a discrepancy between the center axis of the V-shaped groove 86 and the center axis of the narrow groove 81, the optical fiber 82 and the ferrule 78 cannot be fixed linearly. As a result, undesired bent called "micro-bend" occurs in the optical fiber 82. When a circumferential condition of the optical interconnection module is varied, there is a possibility that the optical fiber will rupture at a portion where the micro-bend occurs.

It is not necessarily impossible that the optical fiber 82 and the ferrule 78 are precisely positioned linear in the narrow groove 81 and the wide groove 75 so as to coincide the center axes of the optical fiber 82 and the ferrule 78 with the center axes of the grooves 75 and 81 for preventing the occurrence of the micro-bend. It, however, is necessary to process a surface treatment to the optical fiber 82 to be observed easily, and to prepare a complex and high functional apparatus for precisely positioning the mounting substrate 80 on the package 71. This causes the difficulty of the assembly of the optical interconnection module.

For preventing the occurrence of the micro-bend in the optical fiber 82, it can be considered that the V-shaped groove 86 and the narrow groove 81 to which the optical fiber 82 is fixed and the wide groove 75 to which the ferrule 78 is fixed are formed on the same mounting substrate at the same time. A widths of the V-shaped groove 86 and the narrow groove 81, however, are generally narrower about 140 μm, but a width of the wide groove 75 is much wider about 1500 μm, and a depth of the wide groove 75 is deeper about 600 μm. Thus, the processes for forming these grooves become complex, and the size of the mounting base member becomes larger. This method is not practical.

In the above-mentioned second conventional optical interconnection module, the gel resin is filled in the cavity for increasing tolerance of the optical interconnection. It, however, is not practical, since the interconnection efficiency will be reduced by the existence of the resin. Furthermore, the transparent resin cannot shield the moisture perfectly, so that the moisture intrudes in the inside of the package of the optical interconnection module through a gap between the mounting substrate and the resin or the optical fiber and the resin, or the like.

As a method for forming the package, a transfer molding is conventionally known. It, however, has a problem that a large strain occurs in the inside the optical interconnection module due to the deformation of the package formed by the resin molding. A deformation quantity with respect to Young's modulus of resin is shown in FIG. 21. In FIG. 21, the deformation quantity is a discrepancy between the optical device and the optical fiber after the deformation when the primary deformation is assumed to be zero before the deformation. As can be seen from FIG. 21, the larger the Young's modulus become, the larger the deformation quantity become. Generally, the resin which can be used in the transfer molding has a relatively large Young's modulus of about 20000 N/mm$^2$, so that a very large strain occurs in the vicinity of the optical interconnection portion due to the pressure of the filled resin and the heat in the resin molding. Thus, the optical interconnection characteristic of the optical interconnection module will be largely deteriorated.

In the above-mentioned third conventional optical interconnection module 50 shown in FIG. 20, the mounting substrate is divided into the first mounting substrate 53 on which the semiconductor device 52 is fixed and the second mounting substrate 55 on which the driving circuit 54 is fixed for preventing the trouble caused by the temperature rise. The first and second mounting substrates 53 and 55, however, are contained in the same package 51, so that the heats occurred in the semiconductor laser 52 and in the driving circuit 54 are mutually transmitted between them through the package 51. When the package 51 is formed of a material having a large heat resistance such as an epoxy resin or a glass, the heats generated in the semiconductor laser 52 and in the driving circuit 54 cannot be radiated effectively, so that not only operation of the optical interconnection module becomes unstable, but also the optical interconnection module will be broken by the temperature rise.

Alternatively, when the package 51 is formed of a material having a small heat resistance such as a metal of copper or aluminum or a ceramic of alumina or aluminum nitride, the heats occurred in the semiconductor laser 52 and in the driving circuit 54 are mutually transmitted between them through the package 51 in a short time. Thus, the temperatures of the semiconductor laser 52 and the driving circuit 54 will be risen. When the optical interconnection module 50 is used in a low temperature atmosphere, the temperature rise of the semiconductor laser 52 and the driving circuit 54 causes no problem. However, when the optical interconnection module 50 is used in a high temperature atmosphere, the temperature rise of the semiconductor laser 52 and the driving circuit 54 will cause serious problems.

Furthermore, in the optical interconnection module 50, the semiconductor laser 52 and the driving circuit 54 are respectively fixed on different mounting substrates 53 and 55 disposed at a predetermined distance, so that not only total length of the wiring becomes too long to drive quickly, but also downsizing of the optical interconnection module 50 is difficult.

Still furthermore, the semiconductor laser 52 and the driving circuit 54 are respectively fixed on different mounting substrates 53 and 55, so that the interconnection characteristic of the semiconductor laser 52 and the optical fiber 56 will be varied due to the difference of the thermal expansions in respective portions.

On the other hand, in a secondary mounting for fixing the optical interconnection module on a circuit substrate, lead wires are conventionally soldered between the optical interconnection module and conductive patterns on the circuit substrate for communicating electric signals between the optical interconnection module and an external circuit equipment. By such a conventional mounting method, it is difficult to downsize and to thin the circuit substrate with the optical interconnection module, and it is unsuitable for a high density surface mounting.

Alternatively, it is considered to connect the optical interconnection module directly to the wiring on the circuit substrate by using soldering bumps without using the lead wires. A material of the circuit substrate, however, is generally a resin such as epoxy, and the material of the package of the optical interconnection module is mainly a metal or a ceramic. When the optical interconnection module is fixed on the circuit substrate by the soldering bumps, the circuit substrate will be warped or deformed due to a difference between the thermal expansion coefficients of the materials of the package of the optical interconnection module and the circuit substrate corresponding to the temperature change. The warp of the circuit substrate will cause not only the deterioration of the optical interconnection module, but also the rupture at the connecting point (soldering bump) of the optical interconnection module and the wiring of the circuit substrate. As a result, the electrical connection between the optical interconnection module and the external equipment is broken so that communication system using the optical interconnection module will be failure.

SUMMARY OF THE INVENTION

An object of the present invention is to provide an optical interconnection module and a mounting structure thereof by which an optical fiber and an optical semiconductor device can precisely be interconnected so as to realize a reliable interconnection characteristic in a long term.

An optical interconnection module in accordance with the present invention comprises a first mounting base member and a second mounting base member. At least an optical semiconductor device and an optical fiber interconnected to the optical semiconductor device are held on the first mounting base member. The first mounting base member with the optical semiconductor device and the optical fiber is further fixed on the second mounting base member. At least a gap between the optical semiconductor device and an end face of the optical fiber is filled by a first resin having transparency and moisture resistance. Furthermore, a portion filled by the first resin is covered by a second resin having non-transparency.

By such a configuration, the optical fiber and the optical semiconductor device can precisely be interconnected and firmly fixed on the first mounting base member by the first resin. Since the first resin has transparency, the light emitted from the optical semiconductor device can enter into the optical fiber. Since the first resin has moisture resistance, the optical interconnection portion of the optical semiconductor device and the optical fiber can be protected from affect of the moisture by the first resin. Furthermore, since the optical interconnection portion is covered by non-transparent second resin, external light can be shield by the second resin so as not to enter into the optical fiber. As a result, the reliability of the optical interconnection characteristics of the optical module can be increased, and the characteristics can be maintained in a long term.

DETAILED DESCRIPTION OF THE EMBODIMENT

First Embodiment

Figure 1:
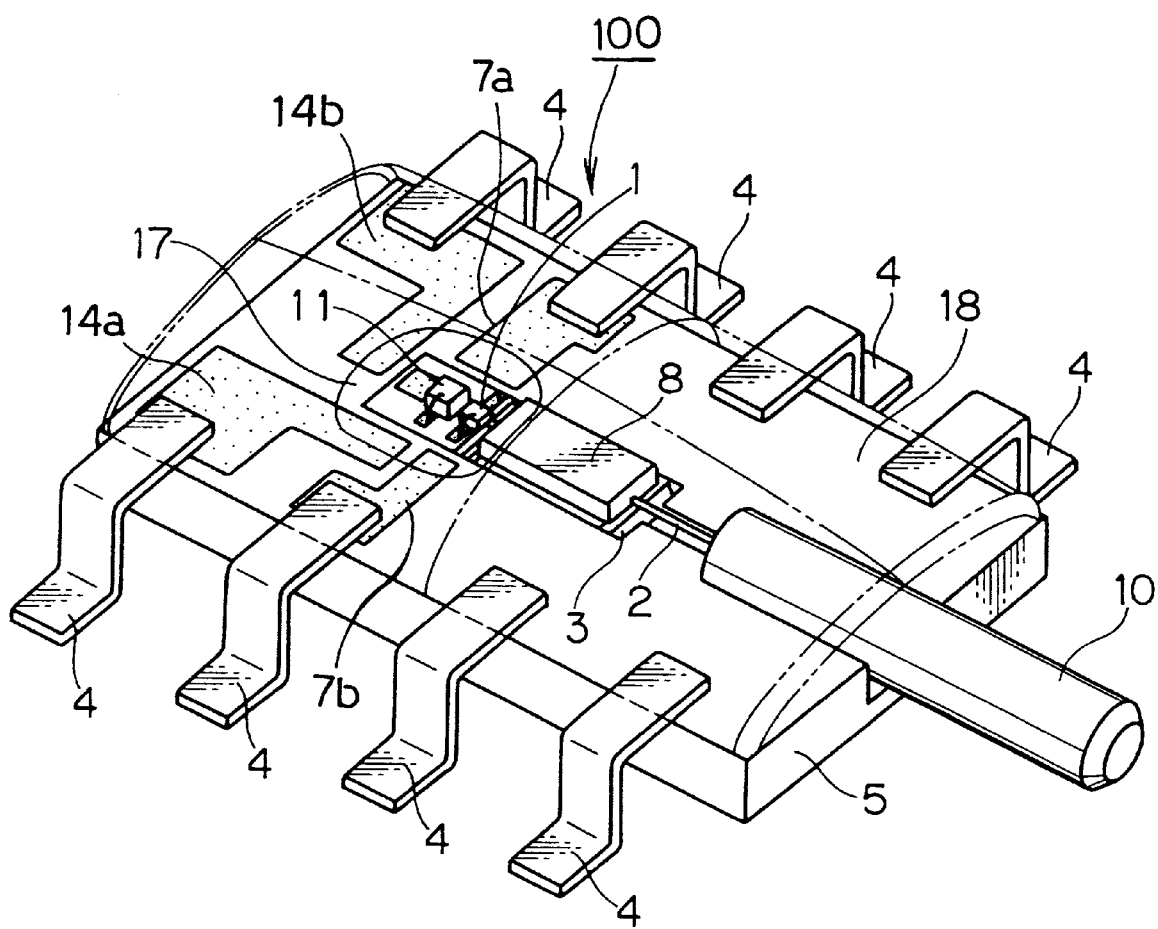
FIG. 1 is a perspective view for showing a configuration of an optical interconnection module in a first embodiment of the present invention.
Figure 2:
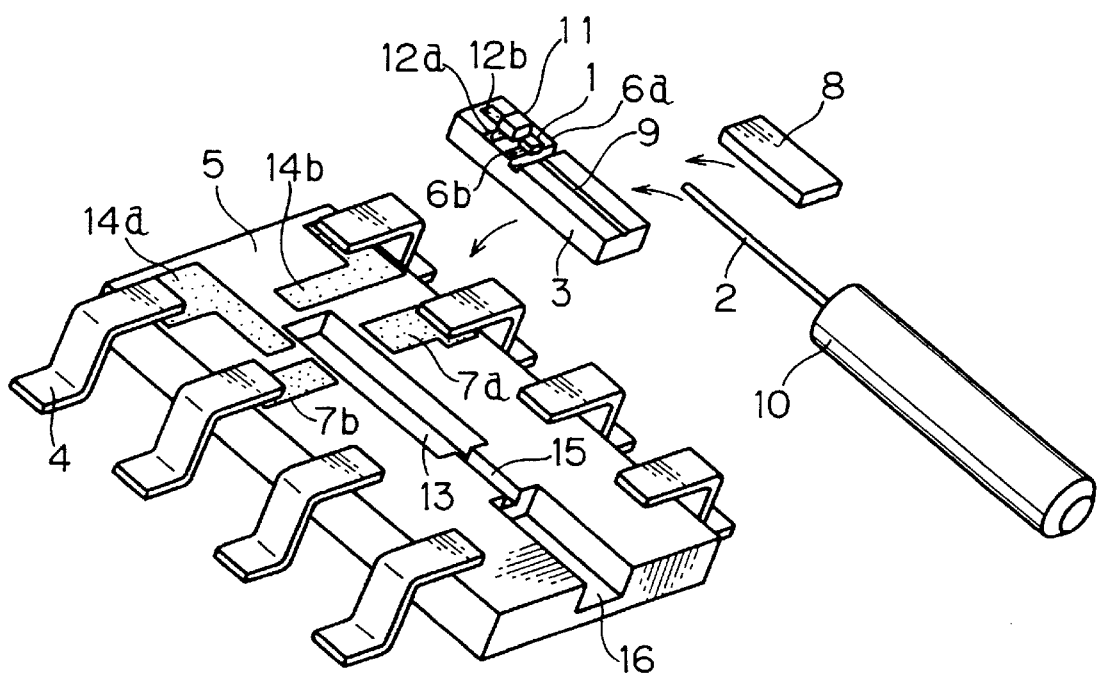
FIG. 2 is an exploded perspective view of the optical interconnection module in the first embodiment.
Figure 3:
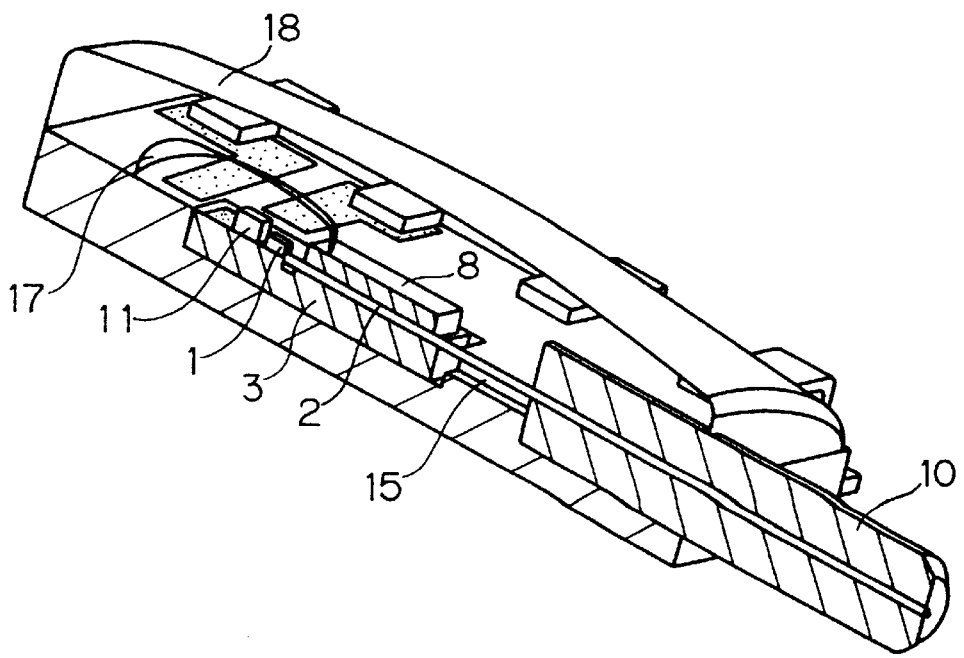
FIG. 3 is a sectional perspective view of the optical interconnection module in the first embodiment.
Figure 4:
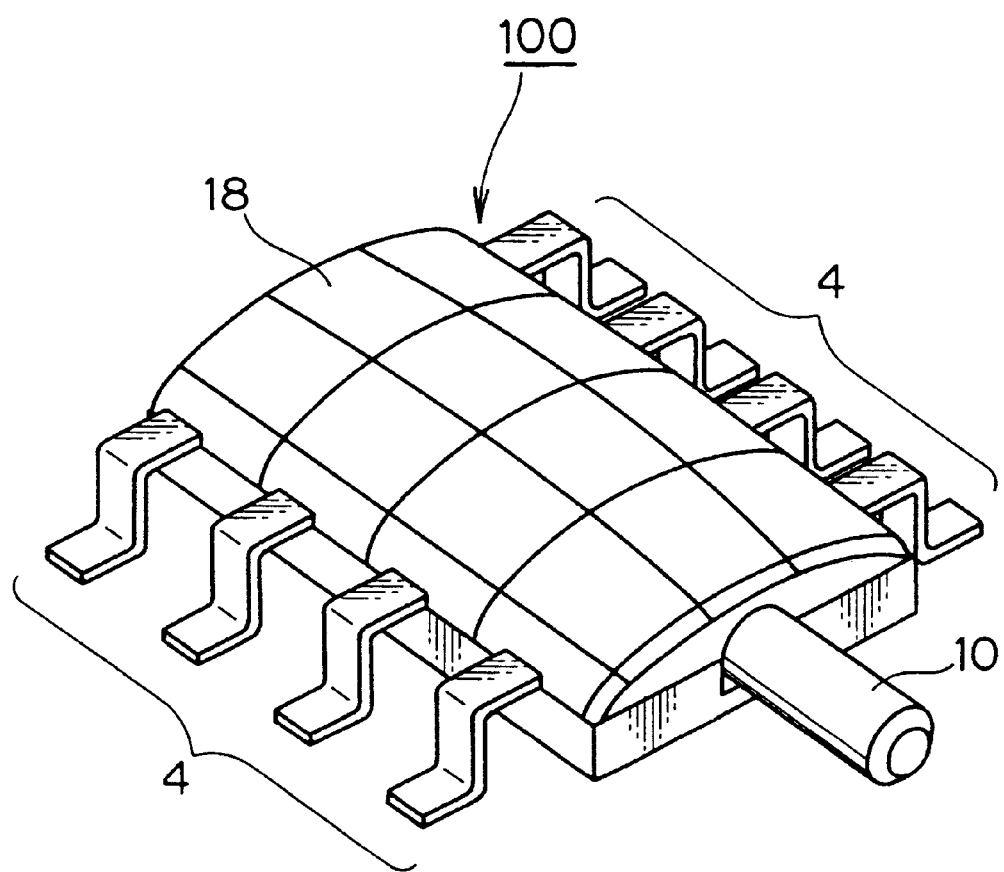
FIG. 4 is a perspective view for showing an appearance of the optical interconnection module in the first embodiment.

A first embodiment of the present invention is described. FIG. 1 shows a configuration of an optical interconnection module 100 in the first embodiment. FIG. 2 shows an exploded configuration of the optical interconnection module 100. FIG. 3 shows a sectional configuration of the optical interconnection module 100. FIG. 4 shows an appearance of the optical interconnection module 100.

As can be seen from the figures, the optical interconnection module 100 comprises a first mounting base member 3 and a second mounting base member 5. The first mounting base member 3 is made of, for example, a single crystalline silicon to which anisotropy etching can be processed. A light emitting device 1 such as a semiconductor laser, which is an example of an optical semiconductor device in the first embodiment, is fixed on the first mounting base member 3. The second mounting base member 5 is, for example, made of a ceramic material. Conductive patterns 7a, 7b, 14a and 14b are formed on a top surface of the second mounting base member 5. A plurality of lead terminals 4 which serve as external conductors are symmetrically provided on the second mounting base member 5. Predetermined ones among the lead terminals 4 are electrically connected to the conductive patterns 7a, 7b, 14a and 14b on the second mounting base member 5.

A photo-sensing device 11 such as a photodiode used for monitoring the light emission of the light emitting device 1 is provided in the vicinity of the light emitting device 1 on the first mounting base member 3. A V-shaped groove 9 for holding an optical fiber 2 is provided on the first mounting base member 3 in a manner so that an end of the optical fiber 2 faces a light emitting layer of the light emitting device 1.

A cover 8, which is made of, for example, silica (glass), is fixed on the first mounting base member 3, so that the optical fiber 2 is held between the first mounting base member 3 and the cover 8. By such a configuration, the optical fiber 2 can be mounted on the first mounting base member 3 precisely. Furthermore, the first mounting base member 3 can be manufactured simply and smoothly by a wafer process.

First conductive patterns (electrode pads) 6a and 6b for the light emitting device 1 and second conductive patterns (electrode pads) 12a and 12b for the photo-sensing device 11 are further formed on the surface of the first mounting base member 3. These conductive patterns 6a, 6b, 12a and 12b are formed by a thin film forming process such as a metallization of Au (gold) so as to communicate electric signals to the devices 1 and 11.

The light emitting device 1 is aligned at a precise position on the conductive pattern 6a with respect to the V-shaped groove 9. A solder such as an alloy of Au—Sn is previously spread on the conductive pattern 6a, and the light emitting device 1 is fixed on the conductive pattern 6a by melting of the solder. Similarly, the photo-sensing device 11 is fixed on the conductive pattern 12a by substantially the same manner. The devices 1 and 11 are respectively connected to the conductive patterns 6b and 12b by Au bonding wires having a diameter about $\phi=25$ $\mu$m. In the following description, the bonding wire(s) will have the same manner.

A single mode optical fiber made of, for example, silica (glass) and having a diameter about $\phi=125$ $\mu$m is used as the optical fiber 2 which is optically interconnected with the light emitting device 1. A ferrule 10 is engaged with an outer periphery in the vicinity of a rear end of the optical fiber 2, The ferrule 10 is precisely formed by a ceramic such as zirconia in a manner to have an outer diameter $\phi=1.25$ mm, an inner diameter substantially the same as but a little larger than the outer diameter of the optical fiber 2 and a length 6 mm. The optical fiber 2 can be optically interconnected with an external optical connector by using the ferrule 10. The optical fiber 2 is indirectly fixed on the second mounting base member 5 by fixing the ferrule 10 on the second mounting base member 5. Such a configuration is called "optical fiber stub structure".

A cavity 13 in which the first mounting base member 3 is contained and a ferrule holder 16 on which the ferrule 10 is disposed are formed on the second mounting base member 5. The cavity 13 has depth substantially the same as a thickness of the first mounting base member 3. A groove 15 is further formed on the second mounting base member 5 between the cavity 13 and the ferrule holder 16 so that occurrence of the micro-bend of the optical fiber 2 can be prevented when the first mounting base member 3 and the optical fiber 2 with the ferrule 10 are mounted on the second mounting base member 5. The groove 15 has a depth about 0.4 mm and a length about 1 mm.

Since the second mounting base member 5 is made of the ceramic material including alumina as a principal component, it can reinforce mechanical strength of the first mounting base member 3 which is made of the single crystalline silicon. Furthermore, the ceramic material has good thermal conductivity, so that it is suitable for a material of the second mounting base member 5 by which heat due to electric current flowing in the lead terminals 4 can be radiated. As a result, a reliable optical interconnection module can be realized.

The conductive patterns 7a, 7b, 14a and 14b on the surface of the second mounting base member 5 to which the lead terminals 4 are connected are designed to be the shortest so as to be optimized with respect to the high frequency characteristics.

A gap between the light emitting device 1 and the end of the optical fiber 2 facing the light emitting device 1 is filled by a first resin 17. Furthermore, the circumferences of the light emitting device 1, the optical fiber 2, the photo-sensing device 11 and the wiring portions on the first and second mounting base members 3 and 5 are sealed or covered by the first resin 17. The first resin 17 is one selected among thermosetting silicone resin, acrylic resin, epoxy resin, and so on, having an optically transparency, a coefficient of moisture absorption smaller than 1%, and a refractive index (for example, 1.4 to 3) equal to or smaller than that of the material of the optical fiber 2. The use of the optically transparent first resin 17 can reduce reflection of light emitted from the light emitting device 1 on the end surface of the optical fiber 2, so that optical interconnection characteristics of the optical interconnection module 100 and a tolerance of the optical interconnection of the optical fiber 2 with the light emitting device 1 can be increased. Furthermore, the thermosetting resin is easy to treat and the deterioration rarely occurs in the optical interconnection portion.

Figure 21:
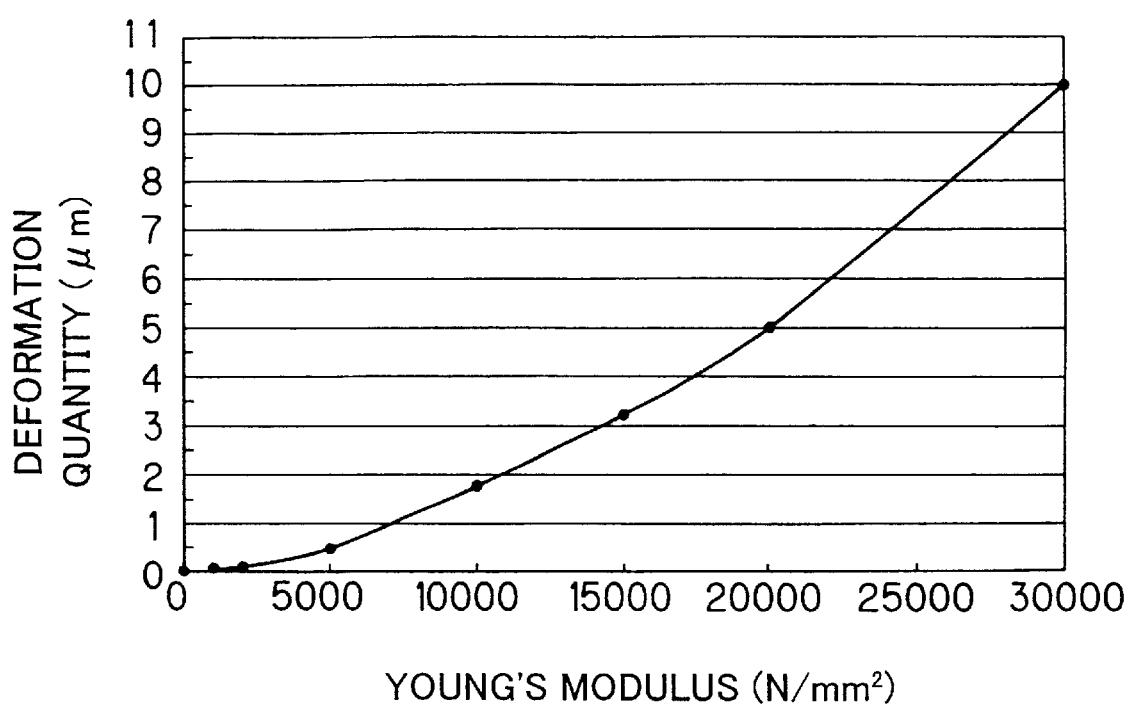
FIG. 21 is a graph for showing a relation between a deformation quantity of a package made of a resin and Young's modulus of the resin.

Furthermore, the surface of the second mounting base member 5 including the above-mentioned first resin 17 and the ferrule 10 is sealed or covered by a non-transparent second resin 18. The second resin 18 is one selected among silicone resin, acrylic resin, epoxy resin, and so on, having an optically non-transparency, and Young's modulus equal to or smaller than 5000 N/mm$_2$. As can be seen from FIG. 21, when Young's modulus of the resin material is 5000 N/mm$^2$, the deformation of the element formed by the resin becomes about 0.5 $\mu$m. Thus, the discrepancy between the light emitting device 1 and the optical fiber 2 in the optical interconnection portion can be reduced by the above-mentioned configuration. The second resin 18 is pigmented not only for absorbing the light emitted from the light emitting diode 1, but also for shielding external light so as not to reach to the optical interconnection portion. As a result, the optical interconnection efficiency of the optical interconnection module 100 can be increased.

A mixture including 15 to 20 Wt % of bisphenol type epoxy resin, 10 to 15 Wt % of acid anhydride curing agent, 3 to 10 Wt % of phenol resin curing agent, 3 to 10 Wt % of silicone resin modifier, and 60 to 65 Wt % of silicic anhydride can be used as the material of the second resin 18, since the mixture has Young' modulus equal to or smaller than 5000 N/mm$^2$.

The term "transparency" and "non-transparency" are defined with respect to the light transmitted between the light emitting device 1 and the optical fiber 2.

Subsequently, assembly process of the above-mentioned optical interconnection module 100 is described. At first, the light emitting device 1 and the photo-sensing device 11 are fixed on the first mounting base member 3, and these elements 1 and 11 and the conductive patterns 6a, 6b, 12a and 12b are wired by bonding wires. The first mounting base member 3 is fixed on the bottom of the cavity 13 of the second mounting base member 5 by a solder or an adhesive, such as an epoxy resin. The optical fiber 2 to which the ferrule 10 is previously engaged is disposed on the first and second mounting base members 3 and 5 in a manner so that the strip portion of the optical fiber 2 is held on the V-shaped groove 9 of the first mounting base member 3 and the ferrule 10 is held on the ferrule holder 16. A UV (ultraviolet) photo-curing adhesive or epoxy resin adhesive is spread on the surface of the first mounting base member 3 surrounding the optical fiber 2 and the cover 8. When the adhesive is cured, the optical fiber 2 is fixed on the V-shaped groove 9.

Similarly, the ferrule 10 is fixed on the ferrule holder 16 by the photo-curing adhesive or epoxy resin adhesive.

When the optical fiber 2 is fixed, the conductive patterns 6a, 6b, 12a and 12b on the first mounting base member 3 are respectively wired to the conductive patterns 7a, 7b, 14a and 14b on the second mounting base member 5 by bonding wires. The light emitting device 1, a part of the optical fiber 2, the photo-sensing device 11, and the wiring portions are sealed by the transparent first resin 17. Finally, the surface of the second mounting base member 5 is sealed by the non-transparent second resin 18, so that the optical interconnection module 100 is completed.

In the optical interconnection module 100 in the first embodiment, the gap between the light emitting device 1 and the optical fiber 2 and the circumference of the optical devices 1 and 11 are filled or sealed by the transparent first resin 17 which shields the moisture, and the surface of the second mounting base member 5 including the first resin 17 is further sealed by the non-transparent second resin 18, so that the reliability of the optical interconnection module can be maintained in a long term.

It is preferable to provide a coupling structure such as a cutting on the second mounting base member 5, by which an optical connector can be engaged with the ferrule 10, easily. Furthermore, it is preferable to use ribbon wires having good high frequency characteristics for wiring the devices 1 and 11 and the conductive patterns 6a, 6b, 12a, 12b, 7a, 7b, 14a and 14b, so that the frequency of the signals transmitted by this optical communication system can be made much higher.

In a secondary mounting for mounting the above-mentioned optical interconnection module 100 on an external circuit substrate by soldering, or the like, it is preferable that the thermal expansion coefficient of the second mounting base member 5 is larger than that of a material of the first mounting base member 3, but smaller than that of a material of the circuit substrate, and Young's modulus of the material of the second mounting base member 5 is larger than not only that of the material of the first mounting base member 3, but also that of the material of the circuit substrate. Furthermore, it is preferable that the circuit substrate is made of a lamination type ceramic material. By such a configuration, the mechanical strength of the first mounting base member 3 can be reinforced sufficiently, so that the affection to the optical interconnection portion on the first mounting base member 3 can be reduced even when the circuit substrate is warped or deformed.

Second Embodiment

Figure 5A:
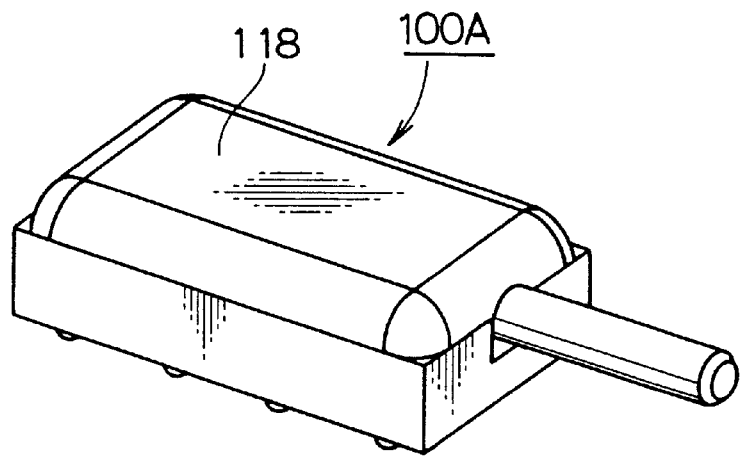
FIG. 5A is a perspective top view for showing an appearance of an optical interconnection module in a second embodiment of the present invention.
Figure 5B:
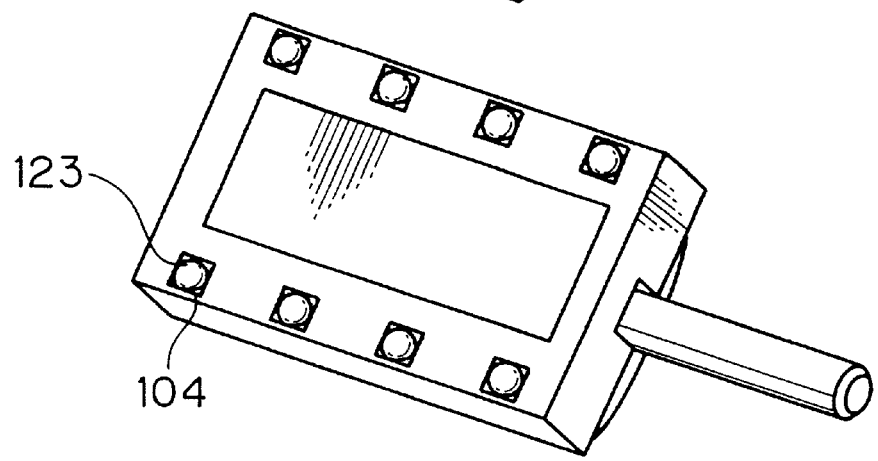
FIG. 5B is a perspective bottom view for showing an appearance of the optical interconnection module in the second embodiment.
Figure 6:
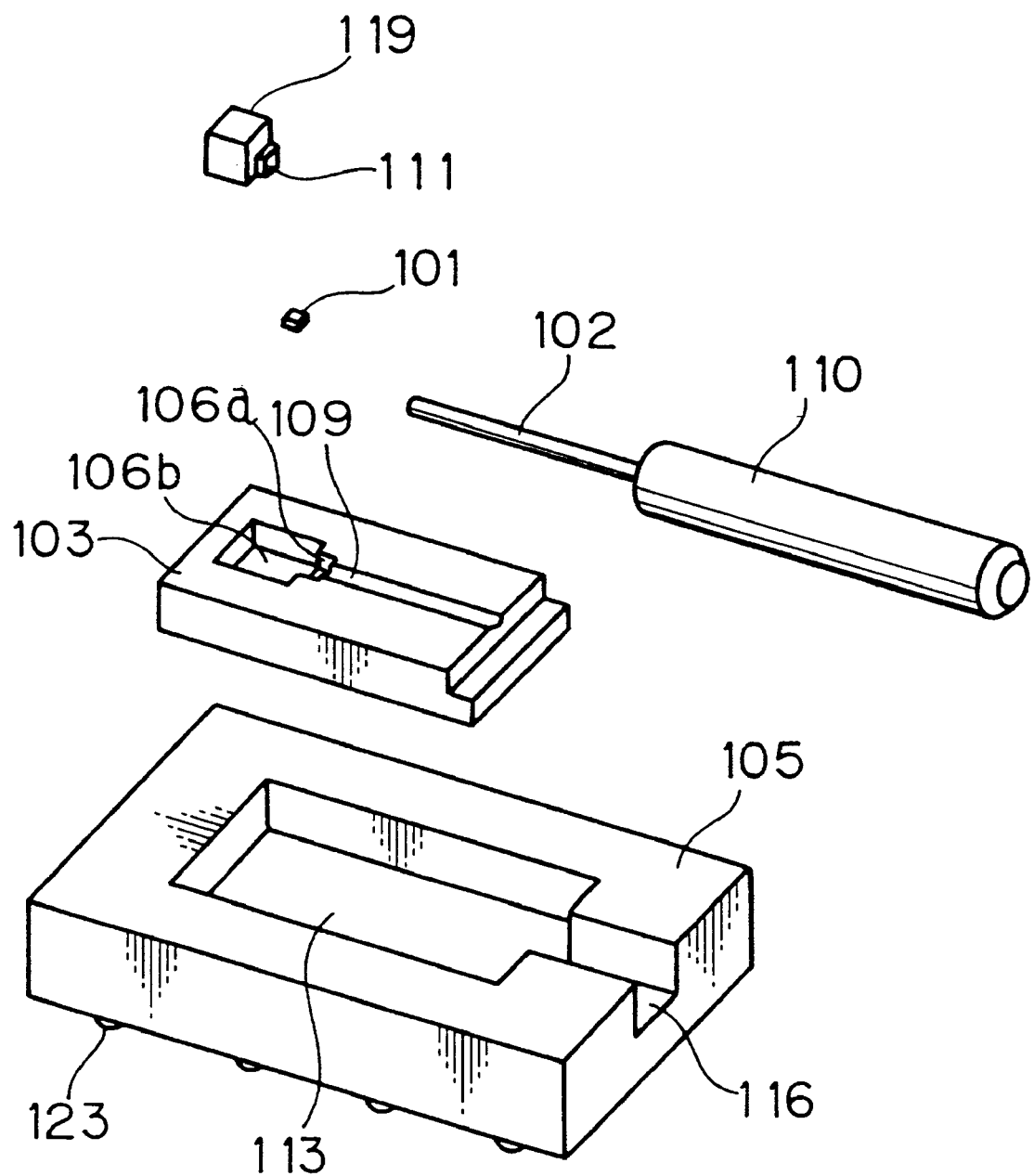
FIG. 6 is an exploded perspective view for showing a configuration of the optical interconnection module in the second embodiment.
Figure 7:
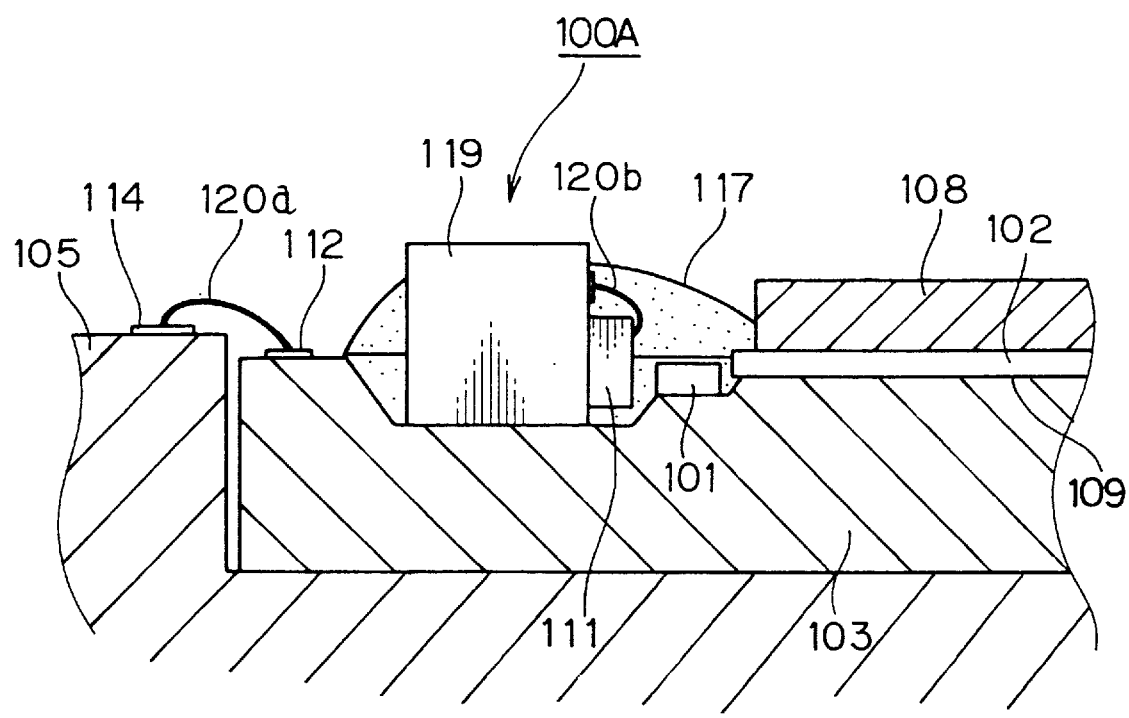
FIG. 7 is a partial sectional view for showing a detailed configuration of an optical interconnection portion of the optical interconnection module in the second embodiment.

A second embodiment of the present invention is described. FIG. 5A shows a top appearance of an optical interconnection module 100A in the second embodiment, and FIG. 5B shows a bottom appearance of the optical interconnection module 100A. FIG. 6 shows a configuration of the optical interconnection module. FIG. 7 shows a sectional configuration of an optical interconnection portion of the optical interconnection module 100A.

A first mounting base member 103 is a single crystalline silicon substrate in which (100) surface of Miller indices corresponds to a principal plane. A V-shaped groove 109 on which an optical fiber 102 is held, a first cavity 106a in which a semiconductor laser 101 is contained, and a second cavity 106b in which a third mounting base member 119 is contained are respectively formed on the principal plane of the first mounting base member 103 by anisotropy etching. The third mounting base member 119 serves as a chip carrier.

The semiconductor laser 101, which is an example of the optical semiconductor device, is a Fabry-Perot type semiconductor laser having a size of 300×300×150 ($\mu$m). A PIN type photodiode 111, which is an example of photo-sensing device, is fixed on the third mounting base member 119 for monitoring light emission of the semiconductor laser 101 in the backward. The third mounting base member 119 is a cubic having a length of 800 $\mu$m per each side thereof, and is made of, for example, a ceramic material including alumina as a principal component. Conductive patterns or electrodes (not shown in the figure) are formed on the bottom faces of the first and second cavities 106a and 106b on which the semiconductor laser 101 and the third mounting base member 119 are fixed. The semiconductor laser 101 and the photodiode 111 are electrically connected to driving circuit by the conductive patterns or electrodes. The conductive patterns or electrodes are formed by lamination of a lower layer of Cr (chromium) and an upper layer of Au (Gold) by a photolithography process. A thin film of Au—Sn alloy (solder) having a thickness of 3 $\mu$m is further provided on each electrode.

In a trial product, the semiconductor laser 101 is visually aligned and mounted on the first mounting base member (silicon substrate) 103 by a junction pickup of a flip-chip mounting machine in a manner so that a light wave guide layer of the semiconductor laser 101 is positioned at a top end. After that, the electrodes and the semiconductor laser 103 are connected by Au bonding wires having a diameter $\phi$=0.25 $\mu$m. The depth of the first cavity 106a is made to be 180 $\mu$m so that the light wave guide layer of the semiconductor laser 101 is disposed by 30 $\mu$m below the principal plane of the silicon substrate as the first mounting base member 103. The width of the V-shaped groove 109 is selected to be 196 $\mu$m in a manner so that the center of the core of the optical fiber 102 is positioned by 30 $\mu$m below the principal plane of the silicon substrate as the first mounting base member 103, when the optical fiber 102 is mounted on the V-shaped groove 109 of the first mounting base member 103. Thus, the center of the core of the optical fiber 102 is coincided with the center of the light wave guide layer of the semiconductor laser 101, so that the optical fiber 102 is interconnected with the semiconductor laser 101.

Similarly, the photodiode 111 is fixed on the third mounting base member 119, and an electrode on a light receiving surface of the photodiode 111 and an electrode on the third mounting base member 119 are connected by an Au bonding wire 120b, as shown in FIG. 7. Subsequently, the third mounting base member 119 is fixed on the bottom face of the second cavity 106b of the first mounting base member 103. The first mounting base member 103 is further fixed on a bottom surface of a cavity 113 of a second mounting base member 105 by an epoxy resin adhesive. The second mounting base member 105 is a kind of circuit substrate made of lamination of ceramic thin plates including alumina as a principal component. Electrodes 112 formed on a surface of the first mounting base member 103 and connected to the optical semiconductor devices 101 and 111 are connected to electrodes 114 formed on a surface of the second mounting base member 105 by Au bonding wires 120a. The electrodes 114 are electrically connected to lands 104 formed on a bottom surface of the second mounting base member 105 (see FIG. 5B). Solder balls 123 are provided on the lands 104 so that the lands 104 would be connected to external circuit by melting of the solder balls 123.

A ferrule 110 made of a ceramic such as zirconia having an outer diameter $\phi$=1.25 mm and a length 6 mm is engaged with the optical fiber 102. The strip portion of the optical fiber 102 is fixed between the V-shaped groove 109 on the first mounting base member 103 and a cover 108 made of silica (glass) by a UV photo-curing adhesive.

A gap between the semiconductor laser 101 and the optical fiber 102 in the first cavity 106a, a gap between the photodiode 111 in the second cavity 106b and the semiconductor laser 101, and the insides of the first and second cavities 106a and 106b are filled or sealed by a transparent silicone resin (first resin) 117 having a refractive index of 1.47. The silicone resin is cured by heating at 150 degrees Celsius in sixty minutes.

A mixture resin (second resin) 118 including 10 Wt % of bisphenol type epoxy resin, 15 Wt % of acid anhydride curing agent, 5 Wt % of phenol resin curing agent, 10 Wt % of silicone resin modifier, and 60 Wt % of silicic anhydride is spread on the surface of the second mounting base member 105 including the first mounting base member 103 and the transparent resin 117. The mixture resin 118 is cured by heating at 150 degrees Celsius in four hours. As a result, the optical interconnection module 100A is completed.

The second mounting base member 105 had a lamination structure that a second layer made of a ceramic is formed on a principal plane of a first layer made of a single crystalline silicon. The first mounting base member 103 is fixed on the principal plane of the first layer of the single crystalline silicon. The ceramic material of the second layer had a thermal expansion coefficient larger than that of the single crystalline silicon but smaller than that of a material of the circuit substrate used in the secondary mounting. Hereupon, the single crystalline silicon had a thermal expansion coefficient of $3\times10^{-6}/°$ C., and Young's modulus of $1.3\times10^{5}$ N/mm². The aluminum nitride included in the ceramic material as a principal component had a thermal expansion coefficient of $5\times10^{-6}/°$ C., and Young's modulus of $3\times10^{6}$ N/mm². The circuit substrate is made of epoxy resin having a thermal expansion coefficient of $15\times10^{-6}/°$ C., and Young's modulus of $2\times10^{5}$ N/mm².

By the above-mentioned configuration of the optical interconnection module 100A, the optical interconnection portion on the first mounting base member 103 is rarely affected due to the warp or deformation of the circuit substrate. Furthermore, the mechanical strength of the first mounting base member 103 can sufficiently be reinforced by the second mounting base member 105, since Young's modulus of the material of the second mounting base member 105 is larger than those of the materials of the first mounting base member 103 and the circuit substrate.

Still furthermore, it is preferable that the conductive patterns formed on the surface of the second mounting base member 105 connected to the lands 104 are designed to be the shortest so as to be optimized with respect to the high frequency characteristics.

Figure 8:
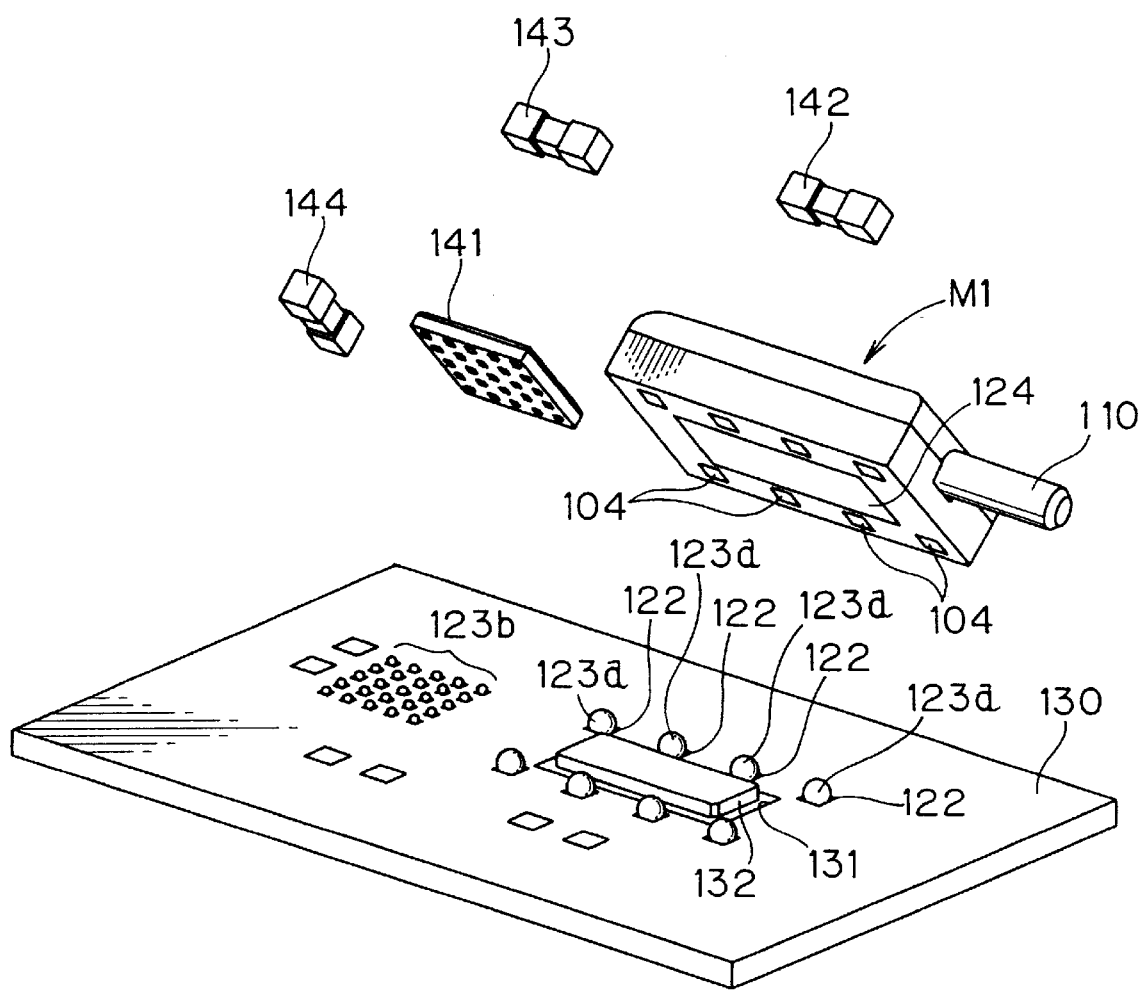
FIG. 8 is an exploded perspective view for showing a configuration of a secondary mounting of the optical interconnection module on a circuit substrate in the second embodiment.
Figure 9:
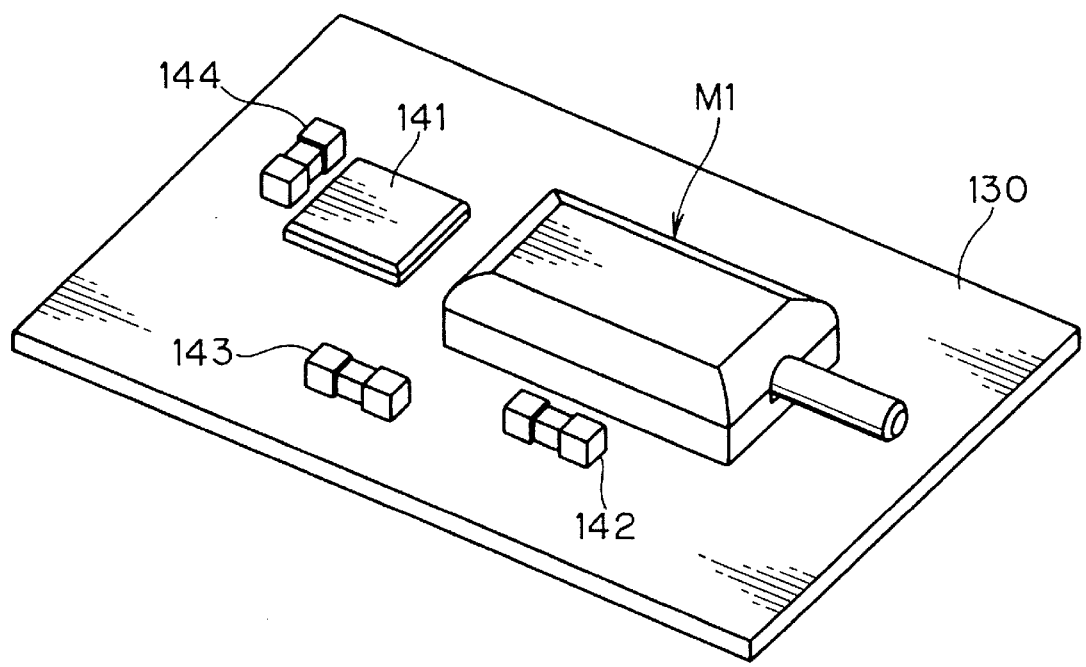
FIG. 9 is a perspective view for showing the configuration of the secondary mounting of the optical interconnection module on the circuit substrate in the second embodiment.

Subsequently, the secondary mounting of the optical interconnection module 100A on a circuit substrate 130 is described with reference to FIGS. 8 and 9. FIG. 8 shows a mounting process of electronic devices including the optical interconnection module 100A on the circuit substrate 130. FIG. 9 shows an appearance of completed circuit substrate of an electronic equipment. In FIG. 8, the solder balls 123a are previously provided on the electric terminals of the circuit substrate 130 instead of the bottom of the optical interconnection module 100A.

The circuit substrate 130 is a multi-layer circuit substrate formed by lamination of insulation layers made of, for example, epoxy resin reinforced by glass fibers and metal layers with inner conductive patterns of, for example, Cu (copper). The optical interconnection module 100A and other devices by which electric power and control signals are supplied to the optical interconnection module 100A are mounted and electrically connected on electric terminals formed on a surface of the circuit substrate 130.

The lands 104 formed on the bottom surface of the second mounting base member 105 of the optical interconnection module 100A are fixed on and electrically connected to terminals 122 which are formed on the surface of the circuit substrate 130 so as to face the lands 104 when the optical interconnection module 100A is mounted on the circuit substrate 130 by reflow soldering process of the solder balls 123a. In the trial product, the solder balls 123a are melted in a reflow furnace at a temperature region 230 to 250 degrees Celsius in about one minute. The melted solder is flown along the conductive pattern on the surface of the circuit substrate 130 by self-align effect, and cured by cooling process.

For cooling the semiconductor devices in the optical interconnection module 100A, thermal via holes (not shown in the figure) are formed in the second mounting base member 105 and connected to an Au metalizing film 124 formed on the bottom surface of the second mounting base member 105.

The Au metalizing film 124 is fixed on a cooling pad 131 on the circuit substrate 130 by solder preform 132 in the solder reflow process. It is preferable to provide radiation fins on or below the circuit substrate for increasing the cooling effect.

A driving IC (Integrated Circuit) 141 for controlling the optical interconnection module 100A, chip electronic devices 142, 143, 144, . . . such as a resistor, a capacitor, and so on are fixed by melting of the solder in the reflow soldering process. Electric connection to the circuit substrate 130 from external circuit or equipment can be realized by providing connectors (not shown in the figure) on the circuit substrate 130.

With respect to the driving IC 141, it is preferable to have a configuration similar to that of the second mounting base member 105. The driving IC 141 has a thermal expansion coefficient a little larger than that of a semiconductor chip (not shown in the figure) but smaller than that of the circuit substrate 130. Young's modulus of the driving IC 141 is larger than those of the semiconductor chip and the circuit substrate 130. Furthermore, it is preferable to fix the driving IC 141 on the circuit substrate 130 by the melting of the solder balls 123b in the reflow soldering process.

Furthermore, it is preferable to provide a coupling structure such as a cutting on the second mounting base member 105, by which an optical connector cab be engaged with the ferrule 110, easily. By such a configuration, the optical fiber 102 rarely receives an affect due to the heat during the reflow soldering process, so that the mounting of the optical interconnection module 100A on the circuit substrate 130 can be realized in mass-production.

In the above-mentioned description of the secondary mounting of the optical interconnection module 100A and the control IC 141 on the circuit substrate 130, the solder balls 123a and 123b are previously provided on the circuit substrate 130. It, however, is possible to provide the solder balls on the optical interconnection module 100A and the control IC 141 similar to the example shown in FIGS. 5A, 5B and 6.

Furthermore, it is possible to form the second mounting base member 105 by the lamination of the ceramic thin plates respectively having different thermal expansion coefficients and Young's modulus varied corresponding to the order of the lamination. By such a configuration, the thermal characteristics of the optical interconnection module 100A can be increased.

Figure 10:
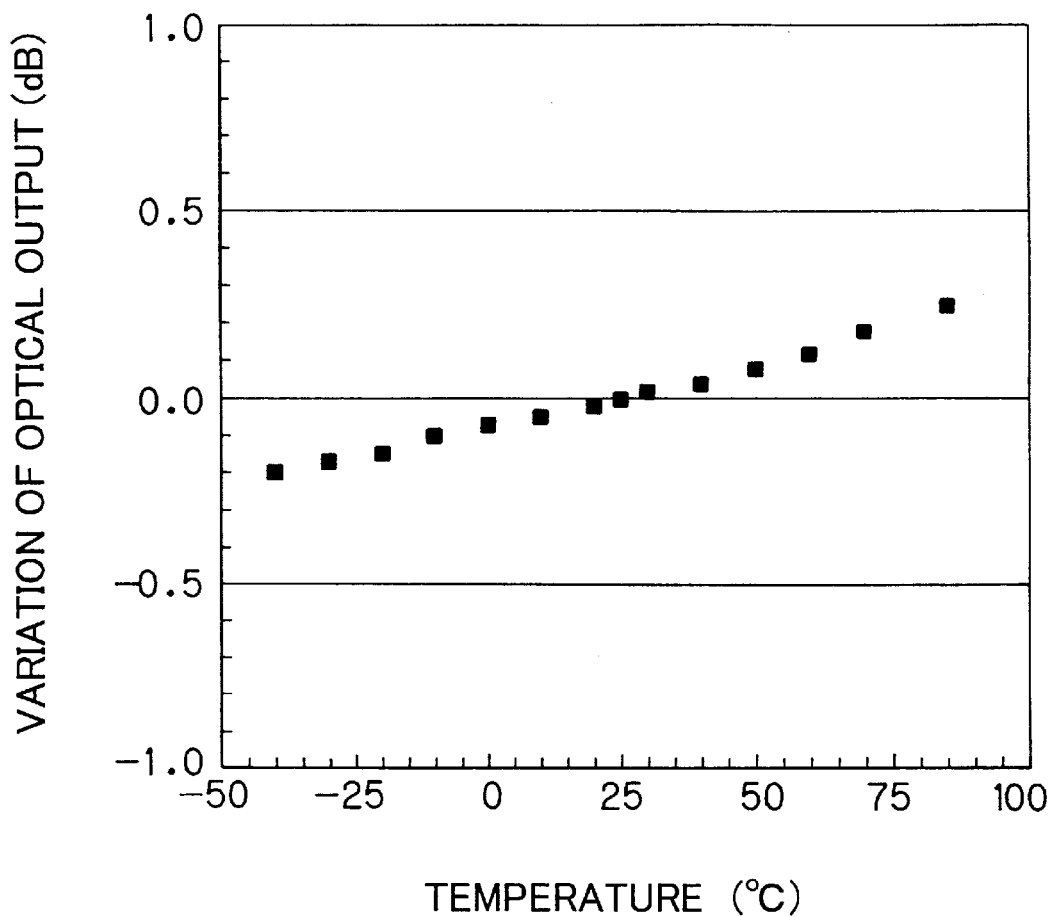
FIG. 10 is a graph for showing a relation between variation of output level of a semiconductor laser and circumferential temperature in the second embodiment.

When the characteristics of the trial product of the optical interconnection module 100A was evaluated, suitable characteristics could be found. Variation of optical output of the optical interconnection module 100A with respect to temperature change from −40 to 85 degrees Celsius in the circumference is shown in FIG. 10. As can be seen from FIG. 10, the variation of the optical output of the optical interconnection module was in a region of ±0.3 dB which was very narrow.

Furthermore, the height of the optical interconnection module 100A could be made lower because of the existence of the first and second cavities 106a and 106b of the first mounting base member 103. Still furthermore, the external stress rarely applied to the semiconductor device 101 and the optical fiber 102 because the optical interconnection portion of the semiconductor device 101 and the optical fiber 102 are doubly enclosed by the first and second mounting base members 103 and 105, so that it could be maintained the optical interconnection characteristic stably in long term.

Third Embodiment

Figure 11:
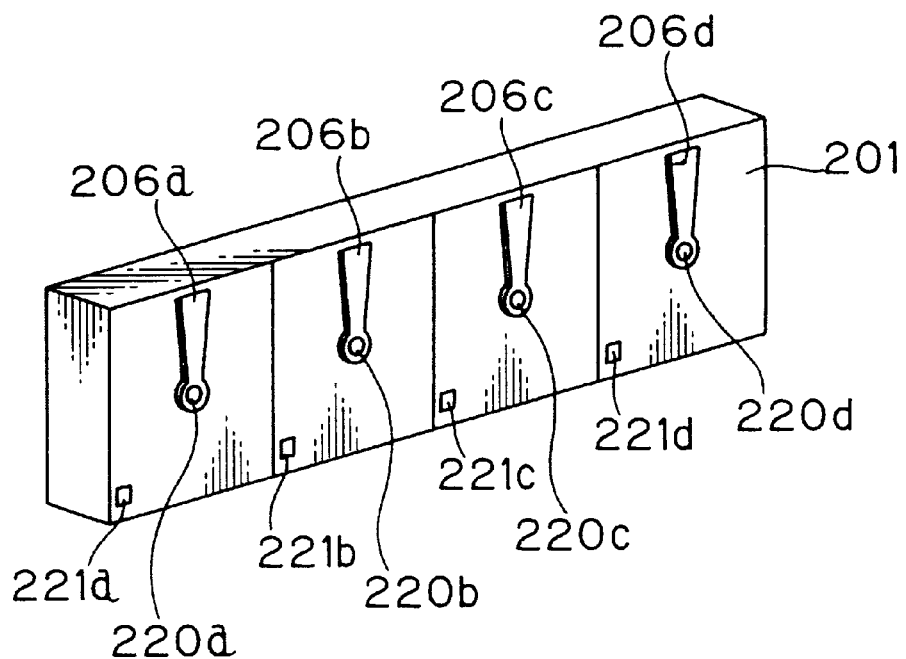
FIG. 11 is a perspective view for showing an appearance of a surface emitting laser used in an optical interconnection module in a third embodiment of the present invention.
Figure 12:
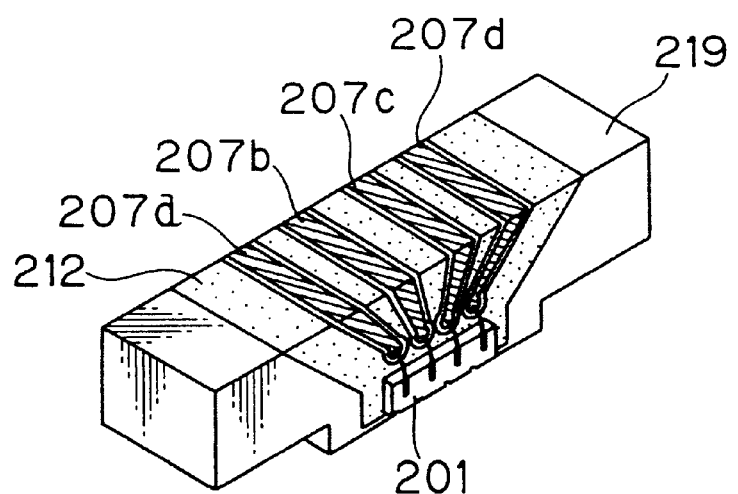
FIG. 12 is a perspective view for showing a configuration of a third mounting base member used the optical interconnection module in the third embodiment.
Figure 13:
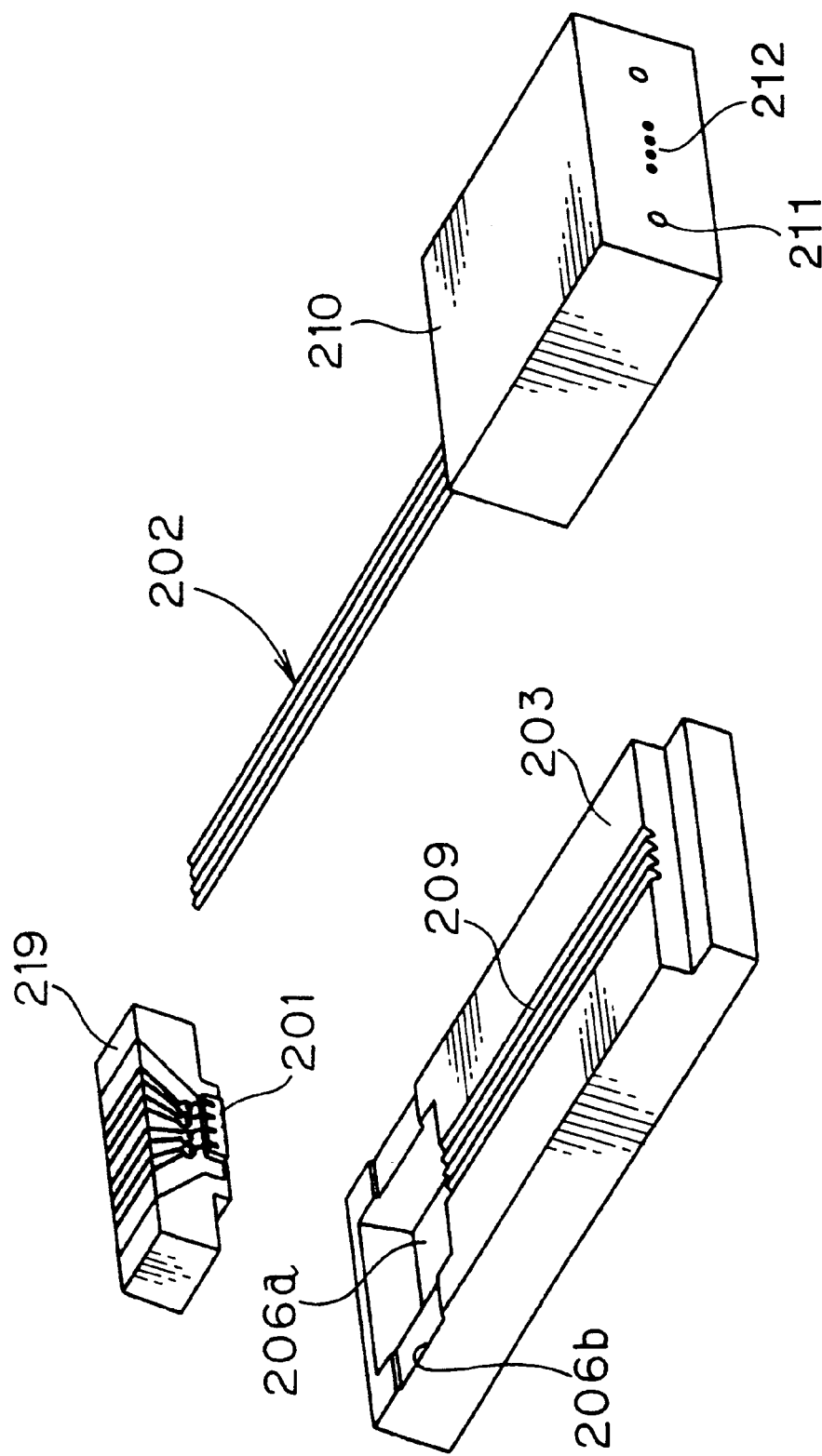
FIG. 13 a perspective view for showing a configuration of an optical sub-assembly of the optical interconnection module in the third embodiment.
Figure 14:
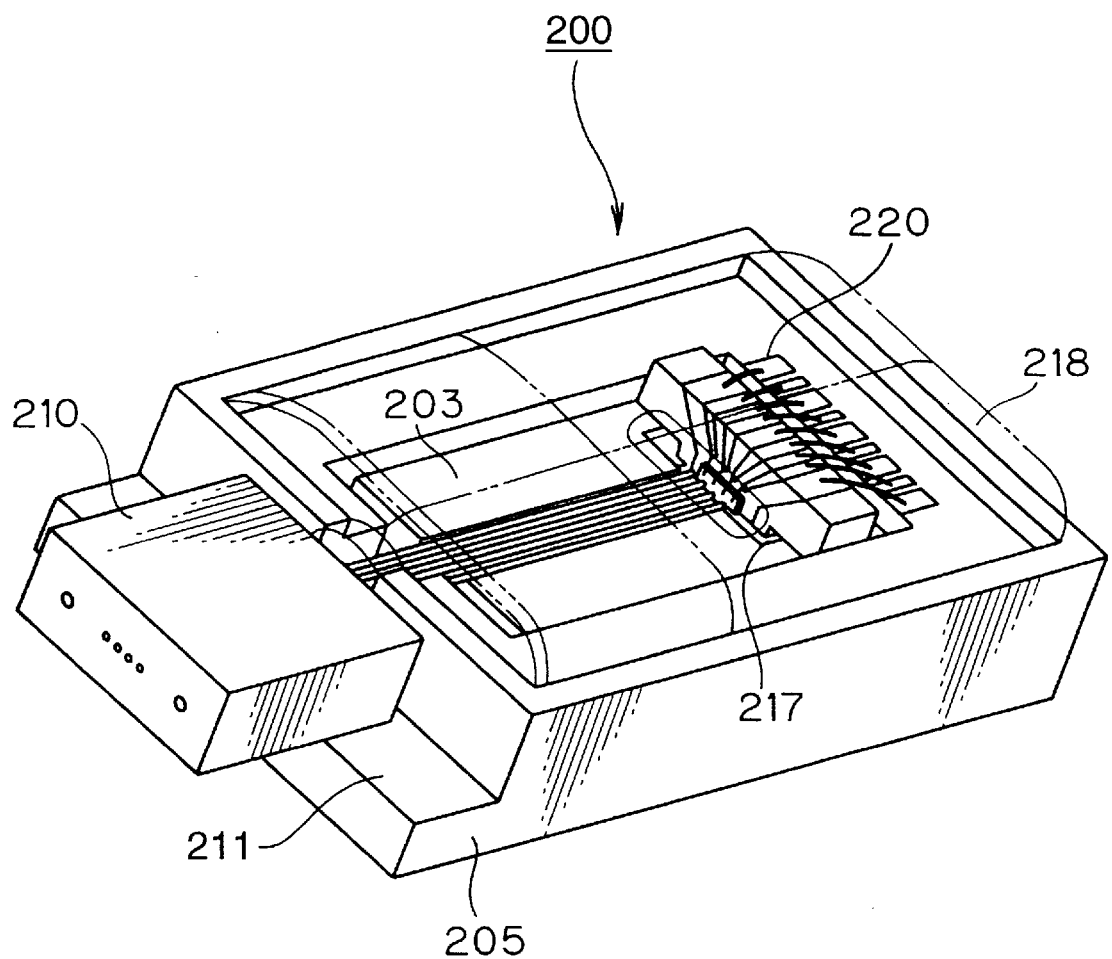
FIG. 14 is a perspective view for showing a configuration of the optical interconnection module in the third embodiment.

A third embodiment of an optical interconnection module in accordance with the present invention is described. FIG. 11 shows an appearance of a surface emitting laser which is a semiconductor device used in the third embodiment. FIG. 12 shows a configuration of a third mounting base member 219 used in the third embodiment. FIG. 13 show a configuration of an optical sub-assembly in the third embodiment. FIG. 14 shows a configuration of an optical interconnection module 200 in the third embodiment.

As shown in FIG. 11, the surface emitting laser 201 (hereupon, called "laser chip")is an array type VCSEL (Vertical Cavity Surface Emitting Laser) having four light emitting portions 220a, 220b, 220c and 220d. The laser chip 201 has a width of 250 μm, a length of 1000 μm, a thickness of 100 μm, and a pitch of the light emitting portions of 250 μm. Four electrodes 206a, 206b, 206c and 206d are respectively provided on a light emitting surface (front surface) of the laser 201 for surrounding the light emitting portions 220a to 220d. A common electrode (not shown in the figure) is provided on a rear surface of the laser chip 201. Furthermore, markers 221a, 221b, 221c and 221d serving as marks made of a metal film such as Au for positioning the laser chip 201 on a mounting base member in a mounting process are provided on the front surface of the laser chip 201.

The third mounting base member 219 is a chip carrier made of a ceramic material including alumina as a principal component. Four coplanar type electrodes 207a, 207b, 207c and 207d are formed on the third mounting base member 219 by a thin film forming process for electrically connecting to the laser chip 201. In a trial product, each coplanar type electrode 207a to 207d had a lamination structure of a Ti (titanium) layer having a thickness of 0.1 μm, a Pd (palladium) layer having a thickness of 0.2 μm, and an Au (gold) layer having a thickness of 2 μm. A width of each electrode 207a to 207d is 200 μm, and a distance between a grounding electrode 212 and each electrode 207a to 207d is 50 μm.

The laser chip 201 is aligned on the grounding electrode 212 by visual alignment, and fixed thereon by melting a solder of Au—Sn alloy having a thickness of 3 μm previously spread on the grounding electrode 212. Subsequently, the electrodes 206a to 206d on the laser chip 201 are connected to the electrodes 207a to 207d on the third mounting base member 219 by Au bonding wires.

A first mounting base member 203 is a single crystalline silicon substrate in which (100) surface of Miller indices corresponds to a principal plane. Four V-shaped grooves 209, on which optical fibers 202 are held, are formed at an interval of 250 μm on the principal plane of the first mounting base member 203 by anisotropy etching. A cavity 206a, in which the laser chip 201 is contained, is further formed on the first mounting base member 203 by anisotropy etching in a manner so that side walls of the cavity 206a are slanted for forming {111} surface having an inclination angle of 54.7 degrees. Furthermore, concave portions 206b having a width of 1 mm and a depth of 10 μm, on which the third mounting base member 219 is disposed, are formed on the surface of the first mounting base member 203 by dicing.

Multi-mode optical fibers of G150 (Graded Index fiber having a core diameter of 50 μm) are used as the optical fibers 202. Four optical fibers 202 are aligned in parallel at an interval of 250 μm on the V-shaped grooves 209 on the first mounting base member 203, and in the vicinities of the ends of the optical fibers 202 are inserted into four fiber holes 212 of a ferrule 210 which is previously molded by epoxy resin. Two coupling holes 211 with which coupling pins of an external connector be engaged are provided on both sides of the fiber holes 212 on the end face of the ferrule 210.

Widths of the V-shaped grooves 209 are selected to be 224 μm in a manner so that the centers of cores of the optical fibers 202 are coincided with the centers of the light emitting portions 220a to 220d of the laser chip 201 when the optical fibers 202 are held on the V-shaped grooves 209 and the third mounting base member 219 with the laser chip 201 is mounted on the concave portions 206b of the first mounting base member 203. At that time, the centers of the light emitting portions 220a to 220d of the laser chip 201 are positioned by 50 μm below the principal plane (surface) of the first mounting base member 203.

The strip portions of the optical fibers 202 are fixed between the V-shaped grooves 209 on the first mounting base member 203 and a cover made of silica (glass) by the UV photo-curing adhesive. The third mounting base member 219 is fixed on the first mounting base member 203 by the epoxy resin adhesive. Thus, the optical sub-assembly shown in FIG. 13 is completed.

A second mounting base member 205 had a lamination structure of ceramic thin plates including alumina as a principal component. A length, a width and a thickness of the second mounting base member 205 in the trial product are respectively 14 mm, 10 mm and 2.5 mm. A cavity, in which the above-mentioned optical sub-assembly is contained, is formed on a principal plane (surface) of the second mounting base member 205. Coplanar electrodes (not shown in the figure) to be connected to the optical semiconductor device are provided on the surfaces of the second mounting base member 205. The coplanar electrodes had a width of 200 μm, and a distance between each coplanar electrode and a grounding electrode is 100 μm. The coplanar electrodes are connected to electrodes provided on a bottom surface of the second mounting base member 205 through inner wires so that the optical semiconductor device in the optical interconnection module 200 could be connected to external circuit or equipment. Solder balls are provided on the electrodes on the bottom surface of the second mounting base member 205 so as to be mounted on an external circuit substrate. Such a structure is called Ball Grid Array, and not shown in the figure. As can be seen from FIG. 14, the second mounting base member 205 in this embodiment has an offset 211 on which the ferrule 210 is disposed.

The optical sub-assembly is fixed on the bottom of the cavity of the second mounting base member 205 by the epoxy resin adhesive. The coplanar electrodes on the third mounting base member 219 and the coplanar electrodes on the second mounting base member 205 are connected by Au ribbon wires 220 having a width of 175 μm. The ferrule 210 is fixed on the offset 211 by the epoxy resin adhesive.

Gaps between the optical fibers 202 and the laser chip 201 in the cavity 206a of the first mounting base member 203 are filled by a transparent silicone resin (first resin) 217 having a refractive index 1.4. The transparent silicone resin 217 is cured at 150 degrees Celsius in sixty minutes.

A mixture resin (second resin) 218 including 10 Wt % of bisphenol type epoxy resin, 15 Wt % of acid anhydride curing agent, 5 Wt % of phenol resin curing agent, 10 Wt % of silicone resin modifier, and 60 Wt % of silicic anhydride is spread on the surface of the second mounting base member 205 including the first mounting base member 203 and the transparent resin 217. The mixture resin 218 is cured by heating at 150 degrees Celsius in four hours. As a result, the optical interconnection module 200 is completed.

When the characteristics of the trial product of the optical interconnection module 200 was evaluated, suitable reliability satisfying the Telcordia generic reliability assurance for optoelectronic devices used in telecommunications equipment generic requirements, which is generally used as a standard for evaluating the products in the art of optical interconnection. Furthermore, the optical interconnection module by which a multi-conductor optical fiber cable can be interconnected, since the VCSEL is used as an optical semiconductor device. As a result, a compact and high speed optical data transmission system can be realized.

Fourth Embodiment

Figure 15:
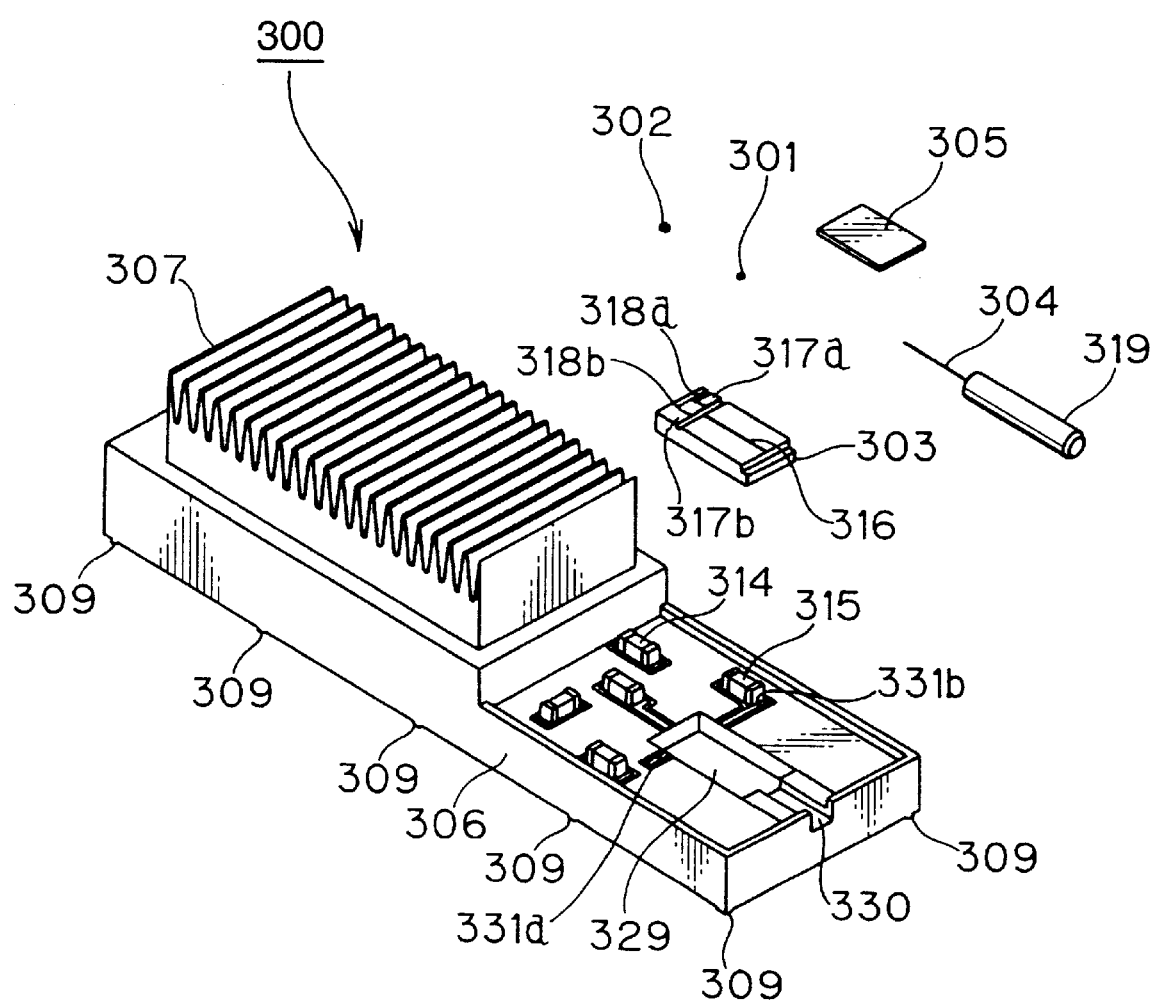
FIG. 15 is an exploded perspective view for showing a configuration of an optical interconnection module in a fourth embodiment of the present invention.
Figure 16:
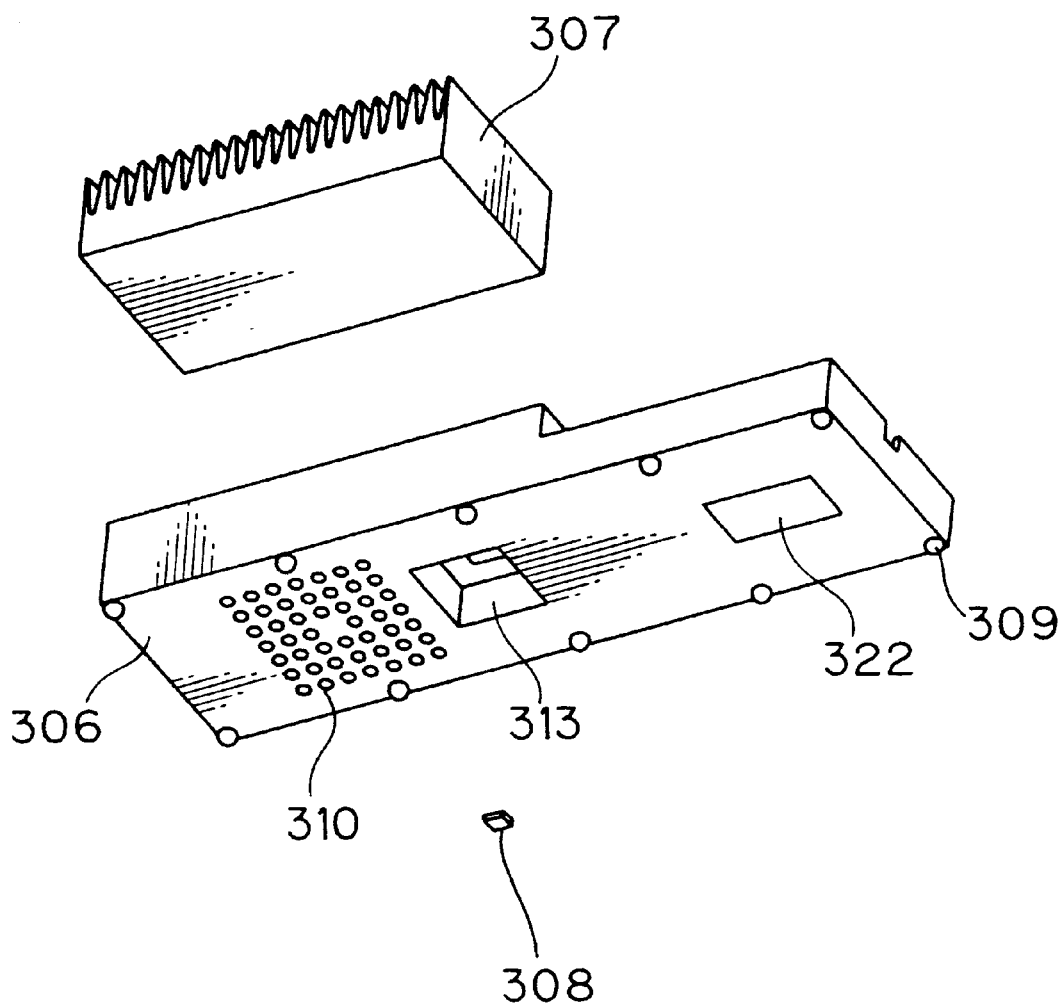
FIG. 16 is a perspective bottom view for showing an appearance of a second mounting base member used in the optical interconnection module in the fourth embodiment.
Figure 17:
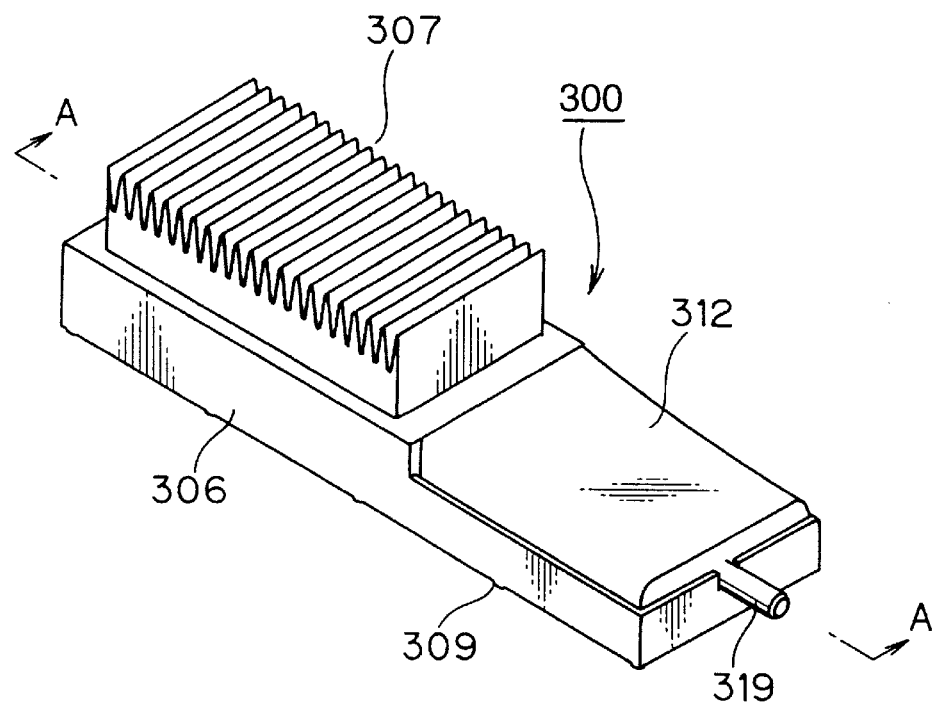
FIG. 17 is a perspective view for showing an appearance of the optical interconnection module in the fourth embodiment.
Figure 18:
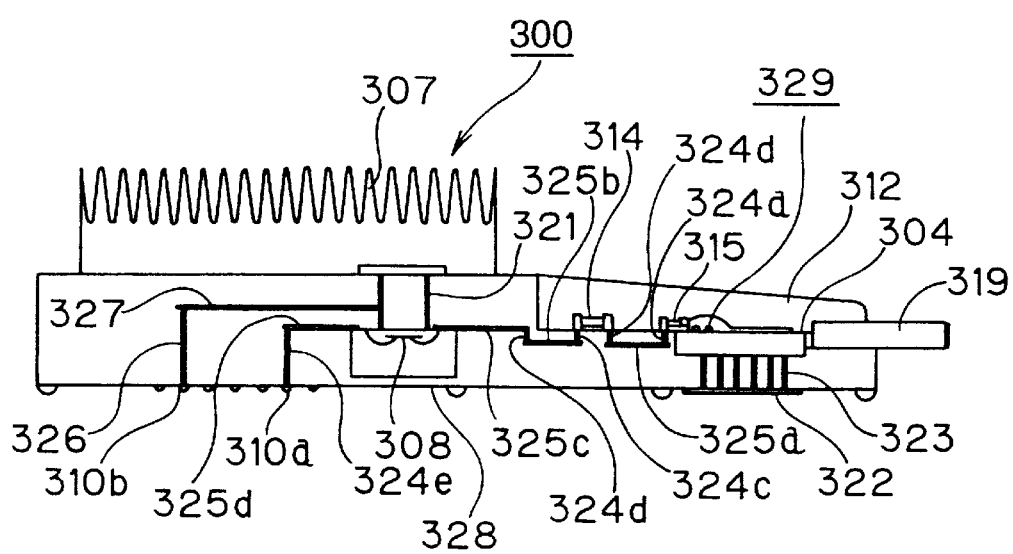
FIG. 18 is a sectional view for showing a detailed configuration of the optical interconnection module in the fourth embodiment.
Figure 19:
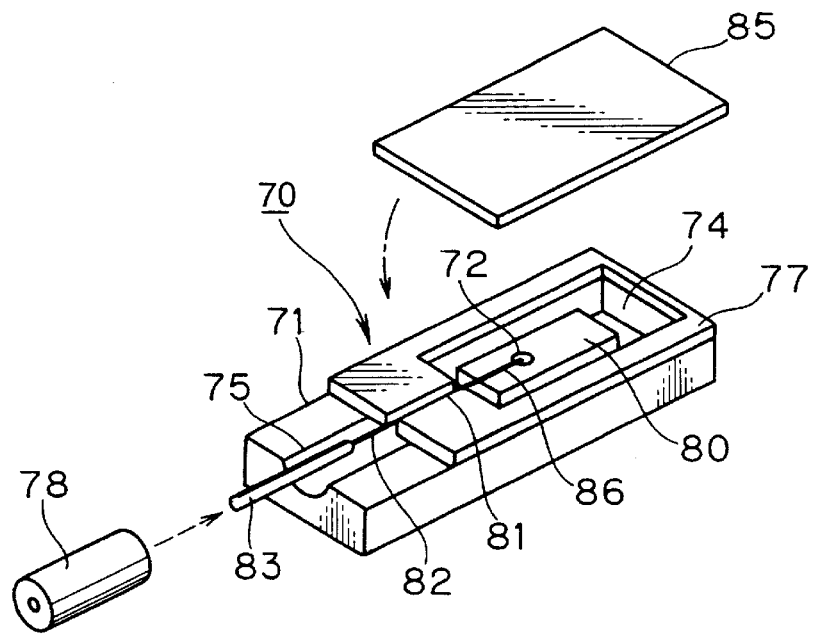
FIG. 19 is a perspective view for showing a configuration of a first conventional optical interconnection module.
Figure 20:
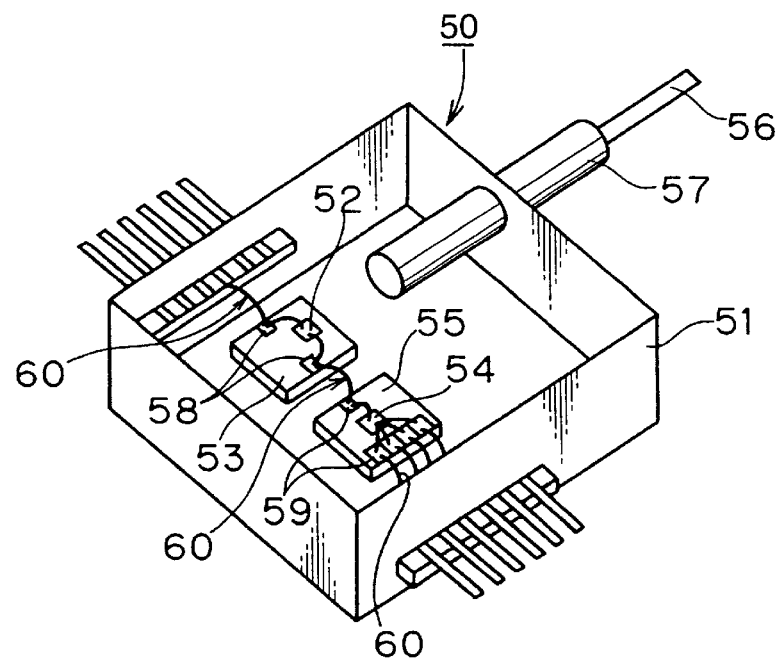
FIG. 20 is a perspective view for showing a configuration of a second conventional optical interconnection module.

A fourth embodiment of an optical interconnection module in accordance with the present invention is described. FIG. 15 shows a configuration of an optical interconnection module 300 in the fourth embodiment. FIG. 16 shows an appearance of a bottom of a second mounting base member used in the fourth embodiment. FIG. 17 shows an appearance of the completed optical interconnection module 300 in the fourth embodiment. FIG. 18 shows a sectional configuration of the optical interconnection module 300 along A—A section in FIG. 17.

In the optical interconnection module 300, a Fabry-Perot type semiconductor laser 301 serving as a light emitting device, a PIN type photodiode 302 serving as a light receiving device, a single-mode optical fiber 304 serving as a light wave guiding member and interconnected to the semiconductor laser 301 are fixed on a first mounting base member 303, The first mounting base member 303 is made of single crystalline silicon which can be etched by anisotropy etching and has a heat conductivity of 168 W/(m.K). The photodiode 302 is disposed in the vicinity of the semiconductor laser 301 for monitoring emitted light from the rear face of the semiconductor laser 301. The intensity of the output light of the semiconductor laser 301 can be controlled by using the monitoring result of the photodiode 302. A V-shaped groove 316 is formed in front of the semiconductor laser 301 by anisotropy etching. A strip portion of the optical fiber 304 is held on the V-shaped groove 316 and fixed between the V-shaped groove 316 and a cover 305 which is made of silica (glass) by the UV photo-curing adhesive. By such a configuration, the optical fiber 304 can be mounted on the first mounting base member 303 precisely, and the sub-assembly of the optical interconnection module can be manufactured simply and smoothly by using wafer process.

Conductive patterns 317a and 317b for the semiconductor laser 301 and conductive patterns 318a and 318b for the photodiode 302 are formed on the first mounting base member 303. These conductive patterns 317a, 317b, 318a and 318b are metallized by Au thin film so that electric signals are transmitted therethrough.

The semiconductor laser 301 is precisely positioned on the conductive pattern 317a with respect to the V-shaped groove 316 by passive alignment, and fixed by melting a solder of Au—Sn alloy previously spread on the conductive pattern 317a. Similarly, the photodiode 302 is fixed on the conductive pattern 318a by substantially the same manner. Furthermore, the semiconductor laser 301 and the photodiode 302 are respectively connected to the conductive patterns 317b and 318b by Au bonding wires.

As the optical fiber 304 which is optically interconnected with the semiconductor laser 301, a single mode optical fiber made of, for example, silica (glass) and having a diameter about φ=125 μm is used. A ferrule 319 which is precisely formed by a ceramic such as zirconia and having an outer diameter φ=1.25 mm and a length 6 mm is engaged with an outer periphery in the vicinity of a rear end of the optical fiber 304, by which the optical fiber 304 can be optically interconnected with an external optical connector. The optical fiber 304 is indirectly fixed on a second mounting base member 306 by fixing the ferrule 319 on the second mounting base member 306.

The first mounting base member 303 is contained in a first cavity 329 and fixed on a bottom surface of the first cavity 329 of the second mounting base member 306. The second mounting base member 306 is made of a ceramic material including alumina as a principal component. A plurality of solder balls 309 and 310 are provided on a bottom surface of the second mounting base member 306, by which the second mounting base member 306 is fixed on an external circuit substrate (not shown) and electrodes or conductive patterns on the second mounting base member 306 can be connected to conductive patterns on the circuit substrate.

The second mounting base member 306 is made of lamination of ceramic thin plates including alumina having a heat conductivity of 20 W/(m.K) or aluminum nitride having a heat conductivity of 150 W/(m.K) as a principal component. Electrodes and inner conductive patterns are formed in the second mounting base member 306. The first cavity 329 in which the first mounting base member 303 is contained is formed on the principal plane (top surface) of the second mounting base member 306, and a second cavity 313 in which a driving IC 308 serving as a control circuit of the semiconductor laser 301 and the photodiode 302 is formed on the bottom surface of the second mounting base member 306, as shown in FIG. 16. As shown in FIG. 18, a radiation base member 321 used for radiating heat generated in the driving IC 308 is provided on the bottom wall of the second cavity 313. The radiation base member 321 has a heat conductivity larger than that of the material of the second mounting base member 306.

A ferrule holder 330 is further formed adjoining the first cavity 329 on the second mounting base member 306 on which the ferrule 319 is disposed. Conductive patterns 331a and 331b are formed on the surface of the second mounting base member 306 in the vicinity of the first cavity 329. The semiconductor laser 301 and the photodiode 302 on the first mounting base member 303 are connected to, for example, the driving IC 308 by the conductive patterns 331a and 331b. Furthermore, the electronic devices 314 and 315 such as a resistor or a capacitor are fixed on the conductive patterns 331a and 331b. The conductive patterns 331a and 331b are further connected to other conductive patterns formed on the bottom surface of the second cavity 313 through the inner conductive patterns such as via holes. By such a configuration, the semiconductor laser 301 and the photodiode 302 on the first mounting base member 303 are connected to the driving IC 308 in the second cavity 313. The land formed on the bottom surface of the second mounting base member 306 and on which the solder balls 309 and 310 are provided are connected to the driving IC 308 and other electronic devices by the inner conductive patterns.

As a material of the above-mentioned radiation base member 321 provided in the second cavity 313, an alloy of CuW having a heat conductivity of 250 W/(m.K) is used, and the radiation base member 321 is fixed on the second mounting base member 306 by brazing. Alternatively, aluminum having a heat conductivity of 240 W/(m.K) or copper having a heat conductivity of 390 W/(m.K) can be used as a material of the radiation base member 321, and the radiation base member 321 can be fixed on the second mounting base member 306 by soldering.

A heat sink 307 made of aluminum is further provided on the top surface of the second mounting base member 306 by a paste material including metal powder for increasing radiation by the radiation base member 321.

A radiation pad made of Au (gold) is provided in the first cavity 329 of the second mounting base member 306 for radiating heat generated in the first mounting base member 303. An external radiator 322 made of an alloy of CuW is formed on the bottom surface of the second mounting base member 306, and the radiation pad and the external radiator 322 are connected by thermal via holes 323.

Solder balls 310a shown in FIG. 18 are connected to electrodes (not shown in the figure) formed on the bottom surface of the second cavity 313 through inner conductive patterns 324e and 325d. The electrodes are connected to the driving IC 308 by bonding wires. The conductive pattern 317a on the first mounting base member 303 shown in FIG. 15 is connected to the conductive pattern 331b on the second mounting base member 306 by a bonding wire. The electronic device 315 such as a chip resistor or a capacitor fixed on the conductive pattern 331b is connected to the electronic device 314 through inner conductive patterns 324a, 325a and 324b. The electronic device 314 is further connected to the electrode formed on the bottom surface of the second cavity 313 through inner conductive patterns 324c, 325c, 324d and 325c. The electrode is connected to the driving IC 308 by the Au bonding wire. Predetermined electrodes to which the terminals of the driving IC 308 are connected are further connected to lands with solder balls 310b formed on the bottom surface of the second mounting base member 306 through inner conductive patterns 326 and 327, so that it is possible to communicate electric signals with an external circuit or equipment.

The second cavity 313 of the second mounting base member 306 is sealed by a metal cover 328 made of covar which is fixed on the second mounting base member 306 by seam welding. Alternatively, the second cavity 313 of the second mounting base member 306 can be sealed using a cover member made of glass or ceramic fixed by adhesive. Furthermore, it is possible to fill a resin into the second cavity 313.

A gap between the semiconductor laser 301 and the optical fiber 304, a gap between the photodiode 302 and the semiconductor laser 301, and circumferences including the bonding portion by the bonding wires are filled by a thermosetting transparent silicone resin (first resin) 329 having a refractive index equal to or larger than that of the optical fiber 304 but smaller than that of the light wave guide layer of the semiconductor laser 301, and having a low moisture permeability or moisture proofness. Furthermore, a circumference of the mounting portion of the first mounting base member 303 on the second mounting base member 306 is covered by a-non-transparent epoxy resin (second resin) 312. As a result, the optical interconnection module 300 is completed.

In the fourth embodiment, since the driving IC 308 is mounted on the radiation base member 321 disposed in the second cavity 313 of the second mounting base member 306, the heat generated in the driving IC 308 can smoothly be radiated by the heat sink 307 and rarely transmitted to the semiconductor laser 301 and the photodiode 302 on the first mounting base member 303 contained in the first cavity 329. On the other hand, since the heat generated in the semiconductor laser 301 and the PIN photodiode 302 is radiated from the external radiator 322 through the radiation pad and the thermal via holes 323, the optical interconnection characteristics of the optical interconnection module 300 can be reliable in a long term.

Furthermore, it is preferable to form the conductive patterns on the first mounting base member 303 and the second mounting base member 306 and the inner conductive patterns in the second mounting base member 306 as microstrip line or coplanar conductor, and to use the ribbon wires as occasion demands, so that the high frequency characteristics such as 2.5 Gbps and 10 Gbps can be obtained.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An optical interconnection module comprising:
 a first mounting base member on which at least an optical semiconductor device and an optical fiber interconnected to the optical semiconductor device are held, and at least a conductive pattern connected to the optical semiconductor device is formed;
 a second mounting base member on which the first mounting base member is disposed, and at least a conductive pattern to be connected to the optical semiconductor device on the first mounting base member for supplying at least electric power;
 a first resin portion filled at least a gap between the optical semiconductor device and an end face of the optical fiber and having transparency and moisture resistance; and
 a second resin portion covering at least the first resin portion and having non-transparency,
 wherein a material of the second mounting base member has thermal expansion coefficient larger than that of a material of the first mounting base member, but smaller than that of a material of a circuit substrate to which the second mounting base member is fixed.

2. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power, a first resin portion filled at least a gap between the optical semiconductor device and an end face of the optical fiber and having transparency and moisture resistance; and a second resin portion covering at least the first resin portion and having non-transparency, wherein a material of the second mounting base member has Young's modulus larger than not only that of a material of the first mounting base member, but also that of a material of a circuit substrate to which the second mounting base member is fixed.

3. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the first mounting base member is made of a single crystalline silicon and the second mounting base member is made of a ceramic material.

4. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the first mounting base member is contained in a cavity formed on the second mounting base member, the optical fiber is disposed through a groove formed on the second mounting base member communicating to the cavity, and the first resin portion is filled in the cavity.

5. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the optical semiconductor device is fixed on a third mounting base member and the third mounting base member is contained in a cavity formed on the first mounting base member.

6. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the first mounting base member is fixed on a principal plane of the second mounting base member, a cavity in which a driving circuit for the optical semiconductor device is provided is formed on another principal plane of the second mounting base member, a radiation base member having a high thermal conductivity is provided in the cavity, and the driving circuit is disposed on the radiation base member for radiating heat generated in the driving circuit.

7. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the second mounting base member has a radiator at a position corresponding to the first mounting base member on a bottom surface with respect to a top surface on which the first mounting base member is fixed for radiating heat generated in the optical semiconductor device.

8. The optical interconnection module in accordance with claim 7, wherein the second mounting base member has thermal via holes for conducting the heat to the radiator.

9. An optical interconnection module comprising:

a first mounting base member on which at least an optical semiconductor device and an optical fiber interconnected to the optical semiconductor device are held, and at least a conductive pattern connected to the optical semiconductor device is formed;

a second mounting base member on which the first mounting base member is disposed, and at least a conductive pattern to be connected to the optical semiconductor device on the first mounting base member for supplying at least electric power;

a first resin portion filled at least a gap between the optical semiconductor device and an end face of the optical fiber and having transparency and moisture resistance; and a second resin portion covering at least the first resin portion and having non-transparency, wherein the first resin is a thermosetting resin having a refractive index equal to or larger than that of a material of the optical fiber, but smaller than that of a light wave guide layer of the optical semiconductor device.

10. A mounting structure of an optical interconnection module on a circuit substrate, wherein the optical interconnection module comprising: a first mounting base member on which at least an optical semiconductor device and an optical fiber interconnected to the optical semiconductor device are held, and at least a conductive pattern connected to the optical semiconductor device is formed; a second mounting base member on which the first mounting base member is disposed, and at least a conductive pattern to be connected to the optical semiconductor device on the first mounting base member for supplying at least electric power; a first resin portion filled at least a gap between the optical semiconductor device and an end face of the optical fiber and having transparency and moisture resistance; and a second resin portion covering at least the first resin portion and non-transparency; and thermal expansion coefficient of a material of the second mounting base member is larger than that of a material of the first mounting base member, but smaller than that of a material of the circuit substrate, and Young's modulus of the material of the second mounting base member is larger than not only that of the material of the first mounting base member, but also that of the material of the circuit substrate.

11. The mounting structure of the optical interconnection module on the circuit substrate in accordance with claim 10, wherein the circuit substrate is made of lamination of ceramic thin layers.

12. The mounting structure of the optical interconnection module on the circuit substrate in accordance with claim 11, wherein the first mounting base member is made of a single crystalline silicon and the second mounting base member is made of a ceramic material.

13. The mounting structure of the optical interconnection module on the circuit substrate in accordance with claim 10, wherein lands connected to conductive patterns on the circuit substrate are provided on a bottom surface of the second mounting base member, and the lands are connected to the optical semiconductor device through inner conductive patterns formed in the second mounting base member.

14. The mounting structure of the optical interconnection module on the circuit substrate in accordance with claim 10, wherein the first resin portion further seals a circumference of the optical semiconductor device and bonding wires connected between the conductive patterns and the optical semiconductor device.

15. The mounting structure of the optical interconnection module on the circuit substrate in accordance with claim 10, wherein the first mounting base member is contained in a cavity formed on the second mounting base member, the optical fiber is disposed through a groove formed on the second mounting base member communicating to the cavity, and the first resin portion is filled in the cavity.

16. The mounting structure of the optical interconnection module on the circuit substrate in accordance with claim 10, wherein the optical semiconductor device is fixed on a third mounting base member and the third mounting base member is contained in a cavity formed on the first mounting base member.

17. The mounting structure of the optical interconnection module on the circuit substrate in accordance with claim 10, wherein the first mounting base member is fixed on a principal plane of the second mounting base member, a cavity in which a driving circuit for the optical semiconductor device is provided is formed on another principal plane of the second mounting base member, a radiation base member having a high thermal conductivity is provided in the cavity, and the driving circuit is disposed on the radiation base member for radiating heat generated in the driving circuit.

* * * * *